(12) United States Patent
Li

(10) Patent No.: US 11,507,499 B2
(45) Date of Patent: Nov. 22, 2022

(54) SYSTEM AND METHOD FOR FACILITATING MITIGATION OF READ/WRITE AMPLIFICATION IN DATA COMPRESSION

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 38 days.

(21) Appl. No.: 16/878,363

(22) Filed: May 19, 2020

(65) Prior Publication Data

US 2021/0365362 A1 Nov. 25, 2021

(51) Int. Cl.
*G06F 12/02* (2006.01)
*G06F 12/0873* (2016.01)
(Continued)

(52) U.S. Cl.
CPC ...... *G06F 12/0246* (2013.01); *G06F 12/0873* (2013.01); *H03M 7/3086* (2013.01); *G06F 2212/401* (2013.01); *G06F 2212/7201* (2013.01)

(58) Field of Classification Search
None
See application file for complete search history.

(56) References Cited

U.S. PATENT DOCUMENTS 3,893,071 A 7/1975 Bossen
4,562,494 A 12/1985 Bond
(Continued)

FOREIGN PATENT DOCUMENTS

JP 2003022209 1/2003
JP 2011175422 9/2011
(Continued)

OTHER PUBLICATIONS https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

(Continued)

*Primary Examiner* — Michael Alsip
(74) *Attorney, Agent, or Firm* — Shun Yao; Yao Legal Services, Inc.

(57) ABSTRACT

The system can receive data to be written to a non-volatile memory in the distributed storage system. The received data can include a plurality of input segments. The system can assign consecutive logical block addresses (LBAs) to the plurality of input segments. The system can then compress the plurality of input segments to generate a plurality of fixed-length compressed segments, with each fixed-length compressed segment aligned with a physical block address (PBA) in a set of PBAs. The system compresses the plurality of input segments to enable an efficient use of storage capacity in the non-volatile memory. Next, the system can write the plurality of fixed-length compressed segments to a corresponding set of PBAs in the non-volatile memory. The system can then create, in a data structure, a set of entries which map the LBAs of the input segments to the set of PBAs. This data structure can be used later by the system when processing a read request including a LBA.

20 Claims, 12 Drawing Sheets

(51) Int. Cl.
　　　*H03M 7/30*　　　(2006.01)
　　　*G06F 3/06*　　　(2006.01)
　　　*G06F 12/04*　　　(2006.01)

(56)　　　　　References Cited

U.S. PATENT DOCUMENTS

| | | |
|---|---|---|
| 4,718,067 A | 1/1988 | Peters |
| 4,775,932 A | 10/1988 | Oxley |
| 4,858,040 A | 8/1989 | Hazebrouck |
| 5,394,382 A | 2/1995 | Hu |
| 5,602,693 A | 2/1997 | Brunnett |
| 5,715,471 A | 2/1998 | Otsuka |
| 5,732,093 A | 3/1998 | Huang |
| 5,802,551 A | 9/1998 | Komatsu |
| 5,930,167 A | 7/1999 | Lee |
| 6,098,185 A | 8/2000 | Wilson |
| 6,148,377 A | 11/2000 | Carter |
| 6,226,650 B1 | 5/2001 | Mahajan et al. |
| 6,243,795 B1 | 6/2001 | Yang |
| 6,457,104 B1 | 9/2002 | Tremaine |
| 6,658,478 B1 | 12/2003 | Singhal |
| 6,795,894 B1 | 9/2004 | Neufeld |
| 7,351,072 B2 | 4/2008 | Muff |
| 7,565,454 B2 | 7/2009 | Zuberi |
| 7,599,139 B1 | 10/2009 | Bombet |
| 7,953,899 B1 | 5/2011 | Hooper |
| 7,958,433 B1 | 6/2011 | Yoon |
| 8,024,719 B2 | 9/2011 | Gorton, Jr. |
| 8,085,569 B2 | 12/2011 | Kim |
| 8,144,512 B2 | 3/2012 | Huang |
| 8,166,233 B2 | 4/2012 | Schibilla |
| 8,260,924 B2 | 9/2012 | Koretz |
| 8,281,061 B2 | 10/2012 | Radke |
| 8,452,819 B1 | 5/2013 | Sorenson, III |
| 8,516,284 B2 | 8/2013 | Chan |
| 8,527,544 B1 | 9/2013 | Colgrove |
| 8,751,763 B1 | 6/2014 | Ramarao |
| 8,819,367 B1 | 8/2014 | Fallone |
| 8,825,937 B2 | 9/2014 | Atkisson |
| 8,832,688 B2 | 9/2014 | Tang |
| 8,868,825 B1 | 10/2014 | Hayes |
| 8,904,061 B1 | 12/2014 | O'Brien, III |
| 8,949,208 B1 | 2/2015 | Xu |
| 9,015,561 B1 | 4/2015 | Hu |
| 9,031,296 B2 | 5/2015 | Kaempfer |
| 9,043,545 B2 | 5/2015 | Kimmel |
| 9,088,300 B1 | 7/2015 | Chen |
| 9,092,223 B1 | 7/2015 | Pani |
| 9,129,628 B1 | 9/2015 | Fallone |
| 9,141,176 B1 | 9/2015 | Chen |
| 9,208,817 B1 | 12/2015 | Li |
| 9,213,627 B2 | 12/2015 | Van Acht |
| 9,213,632 B1 | 12/2015 | Song |
| 9,251,058 B2 | 2/2016 | Nellans |
| 9,258,014 B2 | 2/2016 | Anderson |
| 9,280,472 B1 | 3/2016 | Dang |
| 9,280,487 B2 | 3/2016 | Candelaria |
| 9,311,939 B1 | 4/2016 | Malina |
| 9,336,340 B1 | 5/2016 | Dong |
| 9,436,595 B1 | 9/2016 | Benitez |
| 9,495,263 B2 | 11/2016 | Pang |
| 9,529,601 B1 | 12/2016 | Dharmadhikari |
| 9,529,670 B2 | 12/2016 | O'Connor |
| 9,569,454 B2 | 2/2017 | Ebsen |
| 9,575,982 B1 * | 2/2017 | Sankara Subramanian .................. G06F 3/0608 |
| 9,588,698 B1 | 3/2017 | Karamcheti |
| 9,588,977 B1 | 3/2017 | Wang |
| 9,607,631 B2 | 3/2017 | Rausch |
| 9,671,971 B2 | 6/2017 | Trika |
| 9,722,632 B2 | 8/2017 | Anderson |
| 9,747,202 B1 | 8/2017 | Shaharabany |
| 9,830,084 B2 | 11/2017 | Thakkar |
| 9,836,232 B2 | 12/2017 | Vasquez |
| 9,852,076 B1 | 12/2017 | Garg |
| 9,875,053 B2 | 1/2018 | Frid |
| 9,910,705 B1 | 3/2018 | Mak |
| 9,912,530 B2 | 3/2018 | Singatwaria |
| 9,923,562 B1 | 3/2018 | Vinson |
| 9,933,973 B2 | 4/2018 | Luby |
| 9,946,596 B2 | 4/2018 | Hashimoto |
| 10,013,169 B2 | 7/2018 | Fisher |
| 10,199,066 B1 | 2/2019 | Feldman |
| 10,229,735 B1 | 3/2019 | Natarajan |
| 10,235,198 B2 | 3/2019 | Qiu |
| 10,268,390 B2 | 4/2019 | Warfield |
| 10,318,467 B2 | 6/2019 | Barzik |
| 10,361,722 B2 | 7/2019 | Lee |
| 10,417,086 B2 | 9/2019 | Lin |
| 10,437,670 B1 | 10/2019 | Koltsidas |
| 10,459,663 B2 | 10/2019 | Agombar |
| 10,459,794 B2 | 10/2019 | Baek |
| 10,466,907 B2 | 11/2019 | Gole |
| 10,484,019 B2 | 11/2019 | Weinberg |
| 10,530,391 B2 | 1/2020 | Galbraith |
| 10,635,529 B2 | 4/2020 | Bolkhovitin |
| 10,642,522 B2 | 5/2020 | Li |
| 10,649,657 B2 | 5/2020 | Zaidman |
| 10,649,969 B2 | 5/2020 | De |
| 10,678,432 B1 | 6/2020 | Dreier |
| 10,756,816 B1 | 8/2020 | Dreier |
| 10,831,734 B2 | 11/2020 | Li |
| 10,928,847 B2 | 2/2021 | Suresh |
| 10,990,526 B1 | 4/2021 | Lam |
| 11,016,932 B2 | 5/2021 | Qiu |
| 11,023,150 B2 | 6/2021 | Pletka |
| 11,068,165 B2 | 7/2021 | Sharon |
| 11,068,409 B2 | 7/2021 | Li |
| 11,126,561 B2 | 9/2021 | Li |
| 11,138,124 B2 | 10/2021 | Tomic |
| 11,243,694 B2 | 2/2022 | Liang |
| 11,360,863 B2 | 6/2022 | Varadan |
| 2001/0003205 A1 | 6/2001 | Gilbert |
| 2001/0032324 A1 | 10/2001 | Slaughter |
| 2001/0046295 A1 | 11/2001 | Sako |
| 2002/0010783 A1 | 1/2002 | Primak |
| 2002/0039260 A1 | 4/2002 | Kilmer |
| 2002/0073358 A1 | 6/2002 | Atkinson |
| 2002/0095403 A1 | 7/2002 | Chandrasekaran |
| 2002/0112085 A1 | 8/2002 | Berg |
| 2002/0161890 A1 | 10/2002 | Chen |
| 2003/0074319 A1 | 4/2003 | Jaquette |
| 2003/0145274 A1 | 7/2003 | Hwang |
| 2003/0163594 A1 | 8/2003 | Aasheim |
| 2003/0163633 A1 | 8/2003 | Aasheim |
| 2003/0217080 A1 | 11/2003 | White |
| 2004/0010545 A1 | 1/2004 | Pandya |
| 2004/0066741 A1 | 4/2004 | Dinker |
| 2004/0103238 A1 | 5/2004 | Avraham |
| 2004/0143718 A1 | 7/2004 | Chen |
| 2004/0255171 A1 | 12/2004 | Zimmer |
| 2004/0267752 A1 | 12/2004 | Wong |
| 2004/0268278 A1 | 12/2004 | Hoberman |
| 2005/0038954 A1 | 2/2005 | Saliba |
| 2005/0097126 A1 | 5/2005 | Cabrera |
| 2005/0138325 A1 | 6/2005 | Hofstee |
| 2005/0144358 A1 | 6/2005 | Conley |
| 2005/0149827 A1 | 7/2005 | Lambert |
| 2005/0174670 A1 | 8/2005 | Dunn |
| 2005/0177672 A1 | 8/2005 | Rao |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0031709 A1 | 2/2006 | Hiraiwa |
| 2006/0101197 A1 | 5/2006 | Georgis |
| 2006/0156009 A1 | 7/2006 | Shin |
| 2006/0156012 A1 | 7/2006 | Beeson |
| 2006/0184813 A1 | 8/2006 | Bui |
| 2007/0033323 A1 | 2/2007 | Gorobets |
| 2007/0061502 A1 | 3/2007 | Lasser |
| 2007/0101096 A1 | 5/2007 | Gorobets |
| 2007/0204128 A1 | 8/2007 | Lee |
| 2007/0250756 A1 | 10/2007 | Gower |

(56) References Cited

U.S. PATENT DOCUMENTS

| | | |
|---|---|---|
| 2007/0266011 A1 | 11/2007 | Rohrs |
| 2007/0283081 A1 | 12/2007 | Lasser |
| 2007/0283104 A1 | 12/2007 | Wellwood |
| 2007/0285980 A1 | 12/2007 | Shimizu |
| 2008/0028223 A1 | 1/2008 | Rhoads |
| 2008/0034154 A1 | 2/2008 | Lee |
| 2008/0065805 A1 | 3/2008 | Wu |
| 2008/0082731 A1 | 4/2008 | Karamcheti |
| 2008/0104369 A1 | 5/2008 | Reed |
| 2008/0112238 A1 | 5/2008 | Kim |
| 2008/0163033 A1 | 7/2008 | Yim |
| 2008/0195829 A1 | 8/2008 | Wilsey |
| 2008/0301532 A1 | 12/2008 | Uchikawa |
| 2009/0006667 A1 | 1/2009 | Lin |
| 2009/0089544 A1 | 4/2009 | Liu |
| 2009/0110078 A1 | 4/2009 | Crinon |
| 2009/0113219 A1 | 4/2009 | Aharonov |
| 2009/0125788 A1 | 5/2009 | Wheeler |
| 2009/0177944 A1 | 7/2009 | Kanno |
| 2009/0183052 A1 | 7/2009 | Kanno |
| 2009/0254705 A1 | 10/2009 | Abali |
| 2009/0282275 A1 | 11/2009 | Yermalayeu |
| 2009/0287956 A1 | 11/2009 | Flynn |
| 2009/0307249 A1 | 12/2009 | Koifman |
| 2009/0307426 A1 | 12/2009 | Galloway |
| 2009/0310412 A1 | 12/2009 | Jang |
| 2010/0031000 A1 | 2/2010 | Flynn |
| 2010/0169470 A1 | 7/2010 | Takashige |
| 2010/0217952 A1 | 8/2010 | Iyer |
| 2010/0229224 A1 | 9/2010 | Etchegoyen |
| 2010/0241848 A1 | 9/2010 | Smith |
| 2010/0281254 A1 | 11/2010 | Carro |
| 2010/0321999 A1 | 12/2010 | Yoo |
| 2010/0325367 A1 | 12/2010 | Kornegay |
| 2010/0332922 A1 | 12/2010 | Chang |
| 2011/0031546 A1 | 2/2011 | Uenaka |
| 2011/0055458 A1 | 3/2011 | Kuehne |
| 2011/0055471 A1 | 3/2011 | Thatcher |
| 2011/0060722 A1 | 3/2011 | Li |
| 2011/0072204 A1 | 3/2011 | Chang |
| 2011/0099418 A1 | 4/2011 | Chen |
| 2011/0153903 A1 | 6/2011 | Hinkle |
| 2011/0161621 A1 | 6/2011 | Sinclair |
| 2011/0161784 A1 | 6/2011 | Selinger |
| 2011/0191525 A1 | 8/2011 | Hsu |
| 2011/0218969 A1 | 9/2011 | Anglin |
| 2011/0231598 A1 | 9/2011 | Hatsuda |
| 2011/0239083 A1 | 9/2011 | Kanno |
| 2011/0252188 A1 | 10/2011 | Weingarten |
| 2011/0258514 A1 | 10/2011 | Lasser |
| 2011/0289263 A1 | 11/2011 | McWilliams |
| 2011/0289280 A1 | 11/2011 | Koseki |
| 2011/0292538 A1 | 12/2011 | Haga |
| 2011/0296411 A1 | 12/2011 | Tang |
| 2011/0299317 A1 | 12/2011 | Shaeffer |
| 2011/0302353 A1 | 12/2011 | Confalonieri |
| 2011/0302408 A1 | 12/2011 | McDermott |
| 2012/0017037 A1 | 1/2012 | Riddle |
| 2012/0039117 A1 | 2/2012 | Webb |
| 2012/0084523 A1 | 4/2012 | Littlefield |
| 2012/0089774 A1 | 4/2012 | Kelkar |
| 2012/0096330 A1 | 4/2012 | Przybylski |
| 2012/0117399 A1 | 5/2012 | Chan |
| 2012/0147021 A1 | 6/2012 | Cheng |
| 2012/0151253 A1 | 6/2012 | Horn |
| 2012/0159099 A1 | 6/2012 | Lindamood |
| 2012/0159289 A1 | 6/2012 | Piccirillo |
| 2012/0173792 A1 | 7/2012 | Lassa |
| 2012/0203958 A1 | 8/2012 | Jones |
| 2012/0210095 A1 | 8/2012 | Nellans |
| 2012/0233523 A1 | 9/2012 | Krishnamoorthy |
| 2012/0246392 A1 | 9/2012 | Cheon |
| 2012/0278579 A1 | 11/2012 | Goss |
| 2012/0284587 A1 | 11/2012 | Yu |
| 2012/0324312 A1 | 12/2012 | Moyer |
| 2012/0331207 A1 | 12/2012 | Lassa |
| 2013/0013880 A1 | 1/2013 | Tashiro |
| 2013/0013887 A1 | 1/2013 | Sugahara |
| 2013/0016970 A1 | 1/2013 | Koka |
| 2013/0018852 A1 | 1/2013 | Barton |
| 2013/0024605 A1 | 1/2013 | Sharon |
| 2013/0054822 A1 | 2/2013 | Mordani |
| 2013/0061029 A1 | 3/2013 | Huff |
| 2013/0073798 A1 | 3/2013 | Kang |
| 2013/0080391 A1 | 3/2013 | Raichstein |
| 2013/0138871 A1 | 5/2013 | Chiu |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0159723 A1 | 6/2013 | Brandt |
| 2013/0166820 A1 | 6/2013 | Batwara |
| 2013/0173845 A1 | 7/2013 | Aslam |
| 2013/0179898 A1 | 7/2013 | Fang |
| 2013/0191601 A1 | 7/2013 | Peterson |
| 2013/0205183 A1 | 8/2013 | Fillingim |
| 2013/0219131 A1 | 8/2013 | Alexandron |
| 2013/0227347 A1 | 8/2013 | Cho |
| 2013/0238955 A1 | 9/2013 | D Abreu |
| 2013/0254622 A1 | 9/2013 | Kanno |
| 2013/0318283 A1 | 11/2013 | Small |
| 2013/0318395 A1 | 11/2013 | Kalavade |
| 2013/0329492 A1 | 12/2013 | Yang |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0082412 A1 | 3/2014 | Matsumura |
| 2014/0095758 A1 | 4/2014 | Smith |
| 2014/0095769 A1 | 4/2014 | Borkenhagen |
| 2014/0095827 A1 | 4/2014 | Wei |
| 2014/0108414 A1 | 4/2014 | Stillerman |
| 2014/0108891 A1 | 4/2014 | Strasser |
| 2014/0164447 A1 | 6/2014 | Tarafdar |
| 2014/0164879 A1 | 6/2014 | Tam |
| 2014/0181532 A1 | 6/2014 | Camp |
| 2014/0195564 A1 | 7/2014 | Talagala |
| 2014/0215129 A1 | 7/2014 | Kuzmin |
| 2014/0223079 A1 | 8/2014 | Zhang |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0337457 A1 | 11/2014 | Nowoczynski |
| 2014/0359229 A1 | 12/2014 | Cota-Robles |
| 2014/0365707 A1 | 12/2014 | Talagala |
| 2014/0379965 A1 | 12/2014 | Gole |
| 2015/0006792 A1 | 1/2015 | Lee |
| 2015/0019798 A1 | 1/2015 | Huang |
| 2015/0039849 A1 | 2/2015 | Lewis |
| 2015/0067436 A1 | 3/2015 | Hu |
| 2015/0082317 A1 | 3/2015 | You |
| 2015/0106556 A1 | 4/2015 | Yu |
| 2015/0106559 A1 | 4/2015 | Cho |
| 2015/0121031 A1 | 4/2015 | Feng |
| 2015/0142752 A1 | 5/2015 | Chennamsetty |
| 2015/0143030 A1 | 5/2015 | Gorobets |
| 2015/0186657 A1 | 7/2015 | Nakhjiri |
| 2015/0199234 A1 | 7/2015 | Choi |
| 2015/0227316 A1 | 8/2015 | Warfield |
| 2015/0234845 A1 | 8/2015 | Moore |
| 2015/0269964 A1 | 9/2015 | Fallone |
| 2015/0277937 A1 | 10/2015 | Swanson |
| 2015/0286477 A1 | 10/2015 | Mathur |
| 2015/0294684 A1 | 10/2015 | Qjang |
| 2015/0301964 A1 | 10/2015 | Brinicombe |
| 2015/0304108 A1 | 10/2015 | Obukhov |
| 2015/0310916 A1 | 10/2015 | Leem |
| 2015/0317095 A1 | 11/2015 | Voigt |
| 2015/0341123 A1 | 11/2015 | Nagarajan |
| 2015/0347025 A1 | 12/2015 | Law |
| 2015/0363271 A1 | 12/2015 | Haustein |
| 2015/0363328 A1 | 12/2015 | Candelaria |

(56) References Cited

U.S. PATENT DOCUMENTS

| | | |
|---|---|---|
| 2015/0372597 A1 | 12/2015 | Luo |
| 2016/0014039 A1 | 1/2016 | Reddy |
| 2016/0026575 A1 | 1/2016 | Samanta |
| 2016/0041760 A1 | 2/2016 | Kuang |
| 2016/0048327 A1 | 2/2016 | Jayasena |
| 2016/0048341 A1 | 2/2016 | Constantinescu |
| 2016/0054922 A1 | 2/2016 | Awasthi |
| 2016/0062885 A1 | 3/2016 | Ryu |
| 2016/0077749 A1 | 3/2016 | Ravimohan |
| 2016/0077764 A1 | 3/2016 | Ori |
| 2016/0077968 A1 | 3/2016 | Sela |
| 2016/0078245 A1 | 3/2016 | Amarendran |
| 2016/0098344 A1 | 4/2016 | Gorobets |
| 2016/0098350 A1 | 4/2016 | Tang |
| 2016/0103631 A1 | 4/2016 | Ke |
| 2016/0110254 A1 | 4/2016 | Cronie |
| 2016/0124742 A1 | 5/2016 | Rangasamy |
| 2016/0132237 A1 | 5/2016 | Jeong |
| 2016/0141047 A1 | 5/2016 | Sehgal |
| 2016/0154601 A1 | 6/2016 | Chen |
| 2016/0155750 A1 | 6/2016 | Yasuda |
| 2016/0162187 A1 | 6/2016 | Lee |
| 2016/0179399 A1 | 6/2016 | Melik-Martirosian |
| 2016/0188223 A1 | 6/2016 | Camp |
| 2016/0188890 A1 | 6/2016 | Naeimi |
| 2016/0203000 A1 | 7/2016 | Parmar |
| 2016/0224267 A1 | 8/2016 | Yang |
| 2016/0232103 A1 | 8/2016 | Schmisseur |
| 2016/0234297 A1 | 8/2016 | Ambach |
| 2016/0239074 A1 | 8/2016 | Lee |
| 2016/0239380 A1 | 8/2016 | Wideman |
| 2016/0274636 A1 | 9/2016 | Kim |
| 2016/0283140 A1 | 9/2016 | Kaushik |
| 2016/0306699 A1 | 10/2016 | Resch |
| 2016/0306853 A1 | 10/2016 | Sabaa |
| 2016/0321002 A1 | 11/2016 | Jung |
| 2016/0335085 A1 | 11/2016 | Scalabrino |
| 2016/0342345 A1 | 11/2016 | Kankani |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2016/0381442 A1 | 12/2016 | Heanue |
| 2017/0004037 A1 | 1/2017 | Park |
| 2017/0010652 A1 | 1/2017 | Huang |
| 2017/0068639 A1 | 3/2017 | Davis |
| 2017/0075583 A1 | 3/2017 | Alexander |
| 2017/0075594 A1 | 3/2017 | Badam |
| 2017/0091110 A1 | 3/2017 | Ash |
| 2017/0109199 A1 | 4/2017 | Chen |
| 2017/0109232 A1 | 4/2017 | Cha |
| 2017/0123655 A1 | 5/2017 | Sinclair |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |
| 2017/0177217 A1 | 6/2017 | Kanno |
| 2017/0177259 A1 | 6/2017 | Motwani |
| 2017/0185316 A1 | 6/2017 | Nieuwejaar |
| 2017/0185498 A1 | 6/2017 | Gao |
| 2017/0192848 A1 | 7/2017 | Pamies-Juarez |
| 2017/0199823 A1 | 7/2017 | Hayes |
| 2017/0212680 A1 | 7/2017 | Waghulde |
| 2017/0212708 A1 | 7/2017 | Suhas |
| 2017/0220254 A1 | 8/2017 | Warfield |
| 2017/0221519 A1 | 8/2017 | Matsuo |
| 2017/0228157 A1 | 8/2017 | Yang |
| 2017/0242722 A1 | 8/2017 | Qiu |
| 2017/0249162 A1 | 8/2017 | Tsirkin |
| 2017/0262176 A1 | 9/2017 | Kanno |
| 2017/0262178 A1 | 9/2017 | Hashimoto |
| 2017/0262217 A1 | 9/2017 | Pradhan |
| 2017/0269998 A1 | 9/2017 | Sunwoo |
| 2017/0277655 A1 | 9/2017 | Das |
| 2017/0279460 A1 | 9/2017 | Camp |
| 2017/0285976 A1 | 10/2017 | Durham |
| 2017/0286311 A1 | 10/2017 | Juenemann |
| 2017/0322888 A1 | 11/2017 | Booth |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0033491 A1 | 2/2018 | Marelli |
| 2018/0052797 A1 | 2/2018 | Barzik |
| 2018/0067847 A1 | 3/2018 | Oh |
| 2018/0069658 A1 | 3/2018 | Benisty |
| 2018/0074730 A1 | 3/2018 | Inoue |
| 2018/0076828 A1 | 3/2018 | Kanno |
| 2018/0088867 A1 | 3/2018 | Kaminaga |
| 2018/0107591 A1 | 4/2018 | Smith |
| 2018/0113631 A1 | 4/2018 | Zhang |
| 2018/0143780 A1 | 5/2018 | Cho |
| 2018/0150640 A1 | 5/2018 | Li |
| 2018/0165038 A1 | 6/2018 | Authement |
| 2018/0165169 A1 | 6/2018 | Camp |
| 2018/0165340 A1 | 6/2018 | Agarwal |
| 2018/0167268 A1 | 6/2018 | Liguori |
| 2018/0173620 A1 | 6/2018 | Cen |
| 2018/0188970 A1 | 7/2018 | Liu |
| 2018/0189175 A1 | 7/2018 | Ji |
| 2018/0189182 A1 | 7/2018 | Wang |
| 2018/0212951 A1 | 7/2018 | Goodrum |
| 2018/0219561 A1 | 8/2018 | Litsyn |
| 2018/0226124 A1 | 8/2018 | Perner |
| 2018/0232151 A1 | 8/2018 | Badam |
| 2018/0260148 A1 | 9/2018 | Klein |
| 2018/0270110 A1 | 9/2018 | Chugtu |
| 2018/0293014 A1 | 10/2018 | Ravimohan |
| 2018/0300203 A1 | 10/2018 | Kathpal |
| 2018/0307620 A1 | 10/2018 | Zhou |
| 2018/0321864 A1 | 11/2018 | Benisty |
| 2018/0322024 A1 | 11/2018 | Nagao |
| 2018/0329776 A1 | 11/2018 | Lai |
| 2018/0336921 A1 | 11/2018 | Ryun |
| 2018/0349396 A1 | 12/2018 | Blagojevic |
| 2018/0356992 A1 | 12/2018 | Lamberts |
| 2018/0357126 A1 | 12/2018 | Dhuse |
| 2018/0373428 A1 | 12/2018 | Kan |
| 2018/0373655 A1 | 12/2018 | Liu |
| 2018/0373664 A1 | 12/2018 | Vijayrao |
| 2019/0012111 A1 | 1/2019 | Li |
| 2019/0034454 A1 | 1/2019 | Gangumalla |
| 2019/0042571 A1 | 2/2019 | Li |
| 2019/0050312 A1 | 2/2019 | Li |
| 2019/0050327 A1 | 2/2019 | Li |
| 2019/0065085 A1 | 2/2019 | Jean |
| 2019/0073261 A1 | 3/2019 | Halbert |
| 2019/0073262 A1 | 3/2019 | Chen |
| 2019/0087089 A1 | 3/2019 | Yoshida |
| 2019/0087115 A1 | 3/2019 | Li |
| 2019/0087328 A1 | 3/2019 | Kanno |
| 2019/0108145 A1 | 4/2019 | Raghava |
| 2019/0116127 A1 | 4/2019 | Pismenny |
| 2019/0166725 A1 | 5/2019 | Jing |
| 2019/0171532 A1 | 6/2019 | Abadi |
| 2019/0172820 A1 | 6/2019 | Meyers |
| 2019/0196748 A1 | 6/2019 | Badam |
| 2019/0196907 A1* | 6/2019 | Khan .................. G06F 3/0661 |
| 2019/0205206 A1 | 7/2019 | Hornung |
| 2019/0212949 A1 | 7/2019 | Pletka |
| 2019/0220392 A1 | 7/2019 | Lin |
| 2019/0227927 A1 | 7/2019 | Miao |
| 2019/0272242 A1 | 9/2019 | Kachare |
| 2019/0278654 A1 | 9/2019 | Kaynak |
| 2019/0278849 A1 | 9/2019 | Chandramouli |
| 2019/0317901 A1 | 10/2019 | Kachare |
| 2019/0320020 A1 | 10/2019 | Lee |
| 2019/0339998 A1 | 11/2019 | Momchilov |
| 2019/0361611 A1 | 11/2019 | Hosogi |
| 2019/0377632 A1 | 12/2019 | Oh |
| 2019/0377821 A1 | 12/2019 | Pleshachkov |
| 2019/0391748 A1 | 12/2019 | Li |
| 2020/0004456 A1 | 1/2020 | Williams |

(56) References Cited

U.S. PATENT DOCUMENTS

| | | |
|---|---|---|
| 2020/0004674 A1 | 1/2020 | Williams |
| 2020/0013458 A1 | 1/2020 | Schreck |
| 2020/0042223 A1 | 2/2020 | Li |
| 2020/0042387 A1 | 2/2020 | Shani |
| 2020/0082006 A1 | 3/2020 | Rupp |
| 2020/0084918 A1 | 3/2020 | Shen |
| 2020/0089430 A1 | 3/2020 | Kanno |
| 2020/0092209 A1 | 3/2020 | Chen |
| 2020/0097189 A1 | 3/2020 | Tao |
| 2020/0133841 A1 | 4/2020 | Davis |
| 2020/0143885 A1 | 5/2020 | Kim |
| 2020/0159425 A1 | 5/2020 | Flynn |
| 2020/0167091 A1 | 5/2020 | Haridas |
| 2020/0210309 A1 | 7/2020 | Jung |
| 2020/0218449 A1 | 7/2020 | Leitao |
| 2020/0225875 A1 | 7/2020 | Oh |
| 2020/0242021 A1 | 7/2020 | Gholamipour |
| 2020/0250032 A1 | 8/2020 | Goyal |
| 2020/0257598 A1 | 8/2020 | Yazovitsky |
| 2020/0322287 A1 | 10/2020 | Connor |
| 2020/0326855 A1 | 10/2020 | Wu |
| 2020/0328192 A1 | 10/2020 | Zaman |
| 2020/0348888 A1 | 11/2020 | Kim |
| 2020/0364094 A1 | 11/2020 | Kahle |
| 2020/0371955 A1 | 11/2020 | Goodacre |
| 2020/0387327 A1 | 12/2020 | Hsieh |
| 2020/0401334 A1 | 12/2020 | Saxena |
| 2020/0409559 A1 | 12/2020 | Sharon |
| 2020/0409791 A1 | 12/2020 | Devriendt |
| 2021/0010338 A1 | 1/2021 | Santos |
| 2021/0075633 A1 | 3/2021 | Sen |
| 2021/0089392 A1 | 3/2021 | Shirakawa |
| 2021/0103388 A1 | 4/2021 | Choi |
| 2021/0124488 A1 | 4/2021 | Stoica |
| 2021/0132999 A1 | 5/2021 | Haywood |
| 2021/0191635 A1 | 6/2021 | Hu |
| 2021/0263795 A1 | 8/2021 | Li |
| 2021/0286555 A1 | 9/2021 | Li |

FOREIGN PATENT DOCUMENTS

| | | |
|---|---|---|
| WO | 9418634 | 8/1994 |
| WO | 1994018634 | 8/1994 |

OTHER PUBLICATIONS

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India, pp. 1-7, 2017, <10.1145/3124680.3124741>. <hal-01654985>.

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST '11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14https://www.syncids.com/#.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

Jimenex, X., Novo, D. and P. Ienne, "Pheonix:Reviving MLC Blocks as SLC to Extend NAND Flash Devices Lifetime,"Design, Automation & Text in Europe Conference & Exhibition (Date), 2013.

Yang, T. Wu, H. and W. Sun, "GD-FTL: Improving the Performance and Lifetime of TLC SSD by Downgrading Worn-out Blocks," IEEE 37th International Performance Computing and Communications Conference (IPCCC), 2018.

C. Wu, D. Wu, H. Chou and C. Cheng, "Rethink the Design of Flash Translation Layers in a Component-Based View", in IEEE Acess, vol. 5, pp. 12895-12912, 2017.

Po-Liang Wu, Yuan-Hao Chang and T. Kuo, "A file-system-aware FTL design for flash-memory storage systems," 2009, pp. 393-398.

S. Choudhuri and T. Givargis, "Preformance improvement of block based NAND flash translation layer", 2007 5th IEEE/ACM/IFIP International Conference on Hardware/Software Codesign and Systems Synthesis (CODES+ISSS). Saizburg, 2007, pp. 257-262.

A. Zuck, O. Kishon and S. Toledo. "LSDM: Improving the Preformance of Mobile Storage with a Log-Structured Address Remapping Device Driver", 2014 Eighth International Conference on Next Generation Mobile Apps, Services and Technologies, Oxford, 2014, pp. 221-228.

J. Jung and Y. Won, "nvramdisk: A Transactional Block Device Driver for Non-Volatile RAM", in IEEE Transactions on Computers, vol. 65, No. 2, pp. 589-600, Feb. 1, 2016.

Te I et al. (Pensieve: a Machine Assisted SSD Layer for Extending the Lifetime: (Year: 2018).

ARM ("Cortex-R5 and Cortex-R5F", Technical reference Manual, Revision r1p1) (Year:2011).

* cited by examiner

SYSTEM AND METHOD FOR FACILITATING MITIGATION OF READ/WRITE AMPLIFICATION IN DATA COMPRESSION

BACKGROUND

Field

This disclosure is generally related to the field of data storage. More specifically, this disclosure is related to a system and method for facilitating mitigation of read/write amplification when performing data compression in a data storage system.

Related Art

The proliferation of the Internet and e-commerce continues to create a vast amount of digital content. Today, various distributed storage systems have been created to access and store the ever-increasing amount of digital content. However, network bandwidth and storage capacity of physical resources are two characteristics of distributed storage systems which can greatly impact their performance, cost, and efficiency.

Even with the addition of storage capacity to a distributed storage system, the physical bandwidth can still only support a limited number of users while meeting the requirements of a Service Level Agreement (SLA). For example, when a storage system experiences a heavy load of simultaneous incoming traffic, some drives may become non-responsive due to a lack of sufficient bandwidth, even if sufficient storage capacity is available.

Data compression techniques have been used in distributed storage systems to save storage capacity and to reduce the amount of data transferred, thus enabling the efficient use of storage capacity and communication bandwidth. However, efficiency of the compression techniques has become increasingly critical with the increase in amount of digital content. The existing data compression techniques are inefficient due to the overhead from high read and write amplifications inherent in their data processing operations. Therefore, some challenges still remain in designing an efficient data compression technique that is capable of providing an improved performance of storage systems with regards to latency and an improved efficiency with respect to resource consumption, network load, read/write amplification, etc.

SUMMARY

One embodiment of the present disclosure provides a system and method for facilitating data compression in a distributed storage system. During operation, the system can receive data to be written to a non-volatile memory in the distributed storage system. The received data can include a plurality of input segments. The system can assign consecutive logical block addresses (LBAs) to the plurality of input segments. The system can then compress the plurality of input segments, e.g., by applying a data compression technique, to generate a plurality of fixed-length compressed segments, with each fixed-length compressed segment aligned with a physical block address (PBA) in a set of PBAs. The system compresses the plurality of input segments to enable an efficient use of storage capacity in the non-volatile memory. Next, the system can write the plurality of fixed-length compressed segments to a corresponding set of PBAs in the non-volatile memory. The system can then create, in a data structure, a set of entries which map the LBAs of the input segments to the set of PBAs. This data structure can be used later by the system when processing a read request including a LBA.

In some embodiments, the system can compress the plurality of input segments by: reading sequentially a subset of the plurality of input segments into a sliding window, wherein the subset includes one or more of the input segments; incrementally compressing data in the sliding window until compressed data aligns with a PBA; in response to determining that the compressed data aligns with the PBA: identifying an offset and/or a length of data input corresponding to the compressed data; and writing the compressed data to the PBA in the non-volatile memory; and moving the sliding window consecutively along the plurality of input segments based on the offset and/or the length of the data input.

In some embodiments, the data structure can include: an index field which can include a LBA as an index of the data structure; a PBA field; and a cross-bit field which can indicate whether data in one LBA is written into one PBA or more than one PBA.

In some embodiments, the system can create the set of entries in the data structure by performing the following operations: determining that compressed data associated with a LBA is written into two consecutive PBAs; and setting a flag in a cross-bit field corresponding to the LBA in the data structure.

In some embodiments, the system can receive, from a client, a data read request including the LBA. The system can identify, in the data structure, one or more PBAs corresponding to the LBA. The system can then read compressed data from the one or more PBAs. Next, the system may decompress the compressed data to generate decompressed data. The system can then provide, to the client, requested data based on the decompressed data.

In some embodiments, the system can read the compressed data from the one or more PBAs by: reading the compressed data from one PBA when a flag in a cross-bit field corresponding to the LBA in the data structure is not set; and reading the compressed data from two or more consecutive PBAs when the flag in the cross-bit field corresponding to the LBA in the data structure is set.

In some embodiments, the system can apply erasure coding to the plurality of compressed segments prior to writing the compressed segments to a journal drive.

In some embodiments, the system can apply erasure coding to the plurality of compressed segments prior to writing the compressed segments to different storage nodes in a distributed storage system.

BRIEF DESCRIPTION OF THE FIGURES

In the figures, like reference numerals refer to the same figure elements.

DETAILED DESCRIPTION

Figure 1:
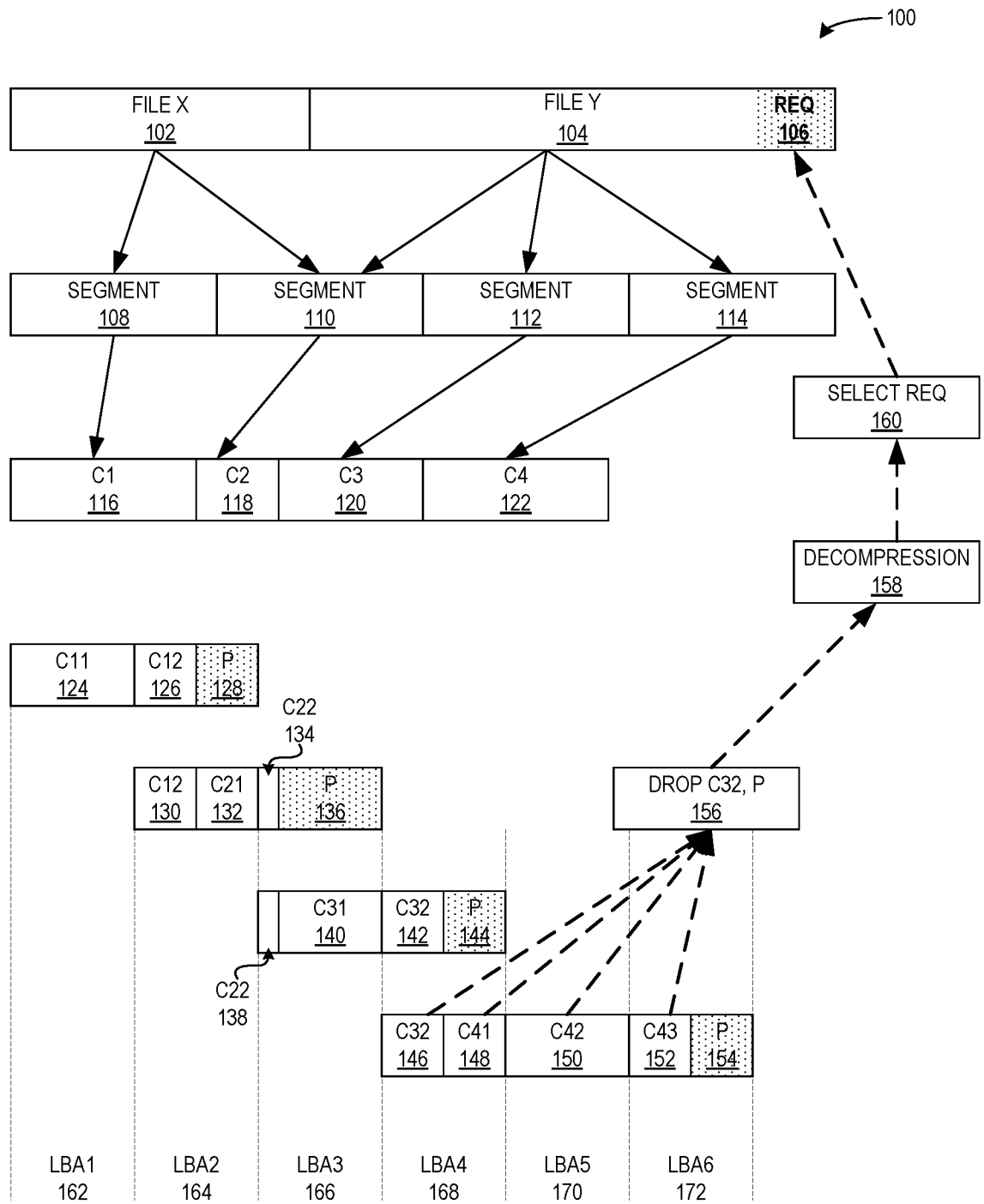
FIG. 1 illustrates an exemplary Input/Output (I/O) amplification in a data compression scheme, in accordance with the prior art.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

Data-intensive operations performed by the existing data compression techniques can result in an increase in the utilization of storage resources. Specifically, existing data compression schemes generate irregular-sized compression results. Aligning these irregular-sized compression results with the LBA can involve additional data-intensive operations resulting in increased read/write amplifications and suboptimal usage of the storage resources. Furthermore, due to the inefficient data compression, decompressing the compressed data can also result in increased read amplification. Therefore, the existing data compression schemes can increase the processing burden on the storage system, increase latency, and can result in wearing out of the storage media or can decrease the life span of the storage media. Such a data compression scheme is described below in relation to FIG. 1 and FIG. 2. A system architecture including a data compression scheme is described below in relation to FIG. 6A.

Embodiments described herein address the above-mentioned drawbacks associated with the existing data compression schemes. Specifically, a system can generate a plurality of PBA-aligned fixed-length compressed data segments from LBA-aligned input data segments by applying a sliding window to these input data segments to mitigate read and write amplification of the storage system. Furthermore, the manner in which the data compression scheme is incorporated within a system architecture of a storage cluster can be changed to result in a reduction in the amount of data transferred within the storage cluster, thereby saving the communication bandwidth. Therefore, by applying the data compression scheme described in the present disclosure, the system can reduce latency, save storage system resources, and enhance the efficiency of the distributed storage system. Such a novel data compression scheme is described below in relation to FIG. 3, FIG. 4, FIG. 5, and FIG. 7. A modified system architecture with the data compression scheme, a computer system, and an apparatus facilitating the data compression scheme are described below in relation to FIG. 6B, FIG. 8, and FIG. 9, respectively.

The term "distributed storage system" refers to a set of compute nodes (or client servers) interacting through a set of storage servers (or storage nodes) via a network, such as a data center network.

The term "storage cluster" refers to a group of storage servers.

The term "storage server" refers to a server in a distributed storage system. A storage server can have multiple drives, where data may be written on to a drive for persistent storage. A storage server can also include a journal associated with the journaling file system. A drive can also include a storage, storage medium, or other storage means associated with the drive.

Data Compression Scheme

FIG. 1 illustrates an exemplary Input/Output (I/O) amplification in a data compression scheme, in accordance with the prior art. A system implementing a data compression scheme 100, receives as input a group of files, e.g., File X 102 and File Y 104, to be compressed. Files 102 and 104 are concatenated and divided into fixed-length segments, e.g., 108-114. Specifically, File X 102 is mapped to segments 108 and 110, while File Y 104 is mapped to segments 110-114. Data compression scheme 100 can compress the segments 108-114 individually to generate variable-length compressed segments C1 116, C2 118, C3 120, and C4 122. Since compressed segments 116-122 are not aligned with LBAs, they are further subject to additional processing.

For example, to write compressed segment 116 into its corresponding LBA1 162, the system implementing data compression scheme 100 can split the compressed segment C1 116 into two portions C11 124 and C12 126. Note that C11 124 aligns with LBA1 162 and hence can be written into a LBA1 162 in a storage drive. However, since length of C12 126 does not align with LBA2 164, i.e., length of C12 126 is less than length of LBA2 164, C12 126 is padded with a certain bit pattern P 128 so that length of 126 is equal to length of LBA2 164. Next, when C2 118 is obtained, the system implementing data compression scheme 100 can reload LBA2 164 from memory, i.e., {C12 130,P 128} is reloaded, and the system can drop P 128 to concatenate with a portion of C2 118. Specifically, the system implementing data compression scheme 100 can split C2 118 into two portions, i.e., C21 132 and C22 134, in a manner that a combination of the first portion of C2, i.e., C21 132, and a last portion of reloaded C1, i.e., C12 130, aligns with LBA2 164. Then the system can write {C12 130,C21 132} into the same LBA2 164. Note that during the process of compressing data, the compressed data, i.e., {C12 130,P 128}, is first written to LBA2 164 only to be read out and re-written with {C12 130,C21 132}. These read and write operations can increase overhead of read/write amplification during the data-intensive compression.

Next, a second portion of C2, i.e., C22 134, is left to be written into subsequent LBA3 166. This can be done by padding a certain bit pattern P 136 to C22 134 so that a combination of 134 and 136 aligns with LBA 3 166. The system can then write C22 134 and P 136 into LBA3 166. When C3 120 is received, the system can reload {C22 138, P 136} and combine it with C31 140 and can drop P 136 prior to writing the new combination into LBA 3 166. The system can continue to perform the reloading of compressed portions from previous LBA and dropping of the padding in this previous LBA before combining the reloaded compressed portion with a consecutive compressed portion. In other words, the system implementing such data-intensive data compression scheme 100 can perform frequent writing, reading, and dropping operations that can result in suboptimal consumption of resources.

Such suboptimal consumption of the resources is also observed when processing a read request for a portion of a file that has been compressed and stored using data compression scheme 100. Specifically, when the system receives a read request to read a part of File Y 104, e.g., portion REQ 106 in File Y 104, the system implementing data compression scheme 100 can first identify where the compressed version of File Y 104 is stored in memory. Then the system may identify that File Y 104 containing the requested portion REQ 106 is included in segment 114 and the compressed version of segment 114 is in segment C4 122. Therefore, data compression scheme reads the whole segment C4 122 from LBA4-LBA6, e.g., LBA4 168, LBA5 170, and LBA6 172. Note that C32 146 in LBA4 168 does not correspond to File Y 104 and hence the system can drop C32 146 and padding P 154 in LBA6 172 at a first stage of processing the read request (operation 156).

The system can then perform decompression of compressed segments: C41 148, C42 150, and C43 152 (operation 158). The system may then select (operation 160) the requested data and send the requested data 106 to the requesting client or source while a remaining portion of segment 114 that does not include the requested data can be dropped at a second stage of processing the read request. Note that when processing a read request, irrelevant data, e.g., C32 146, C41 148, C42 150, and P 154, are read and dropped resulting in read amplification. The system implementing data compression scheme 100 can result in I/O amplification which can increase the processing burden, latency, and can result in a reduced lifespan of the storage media.

Figure 2:
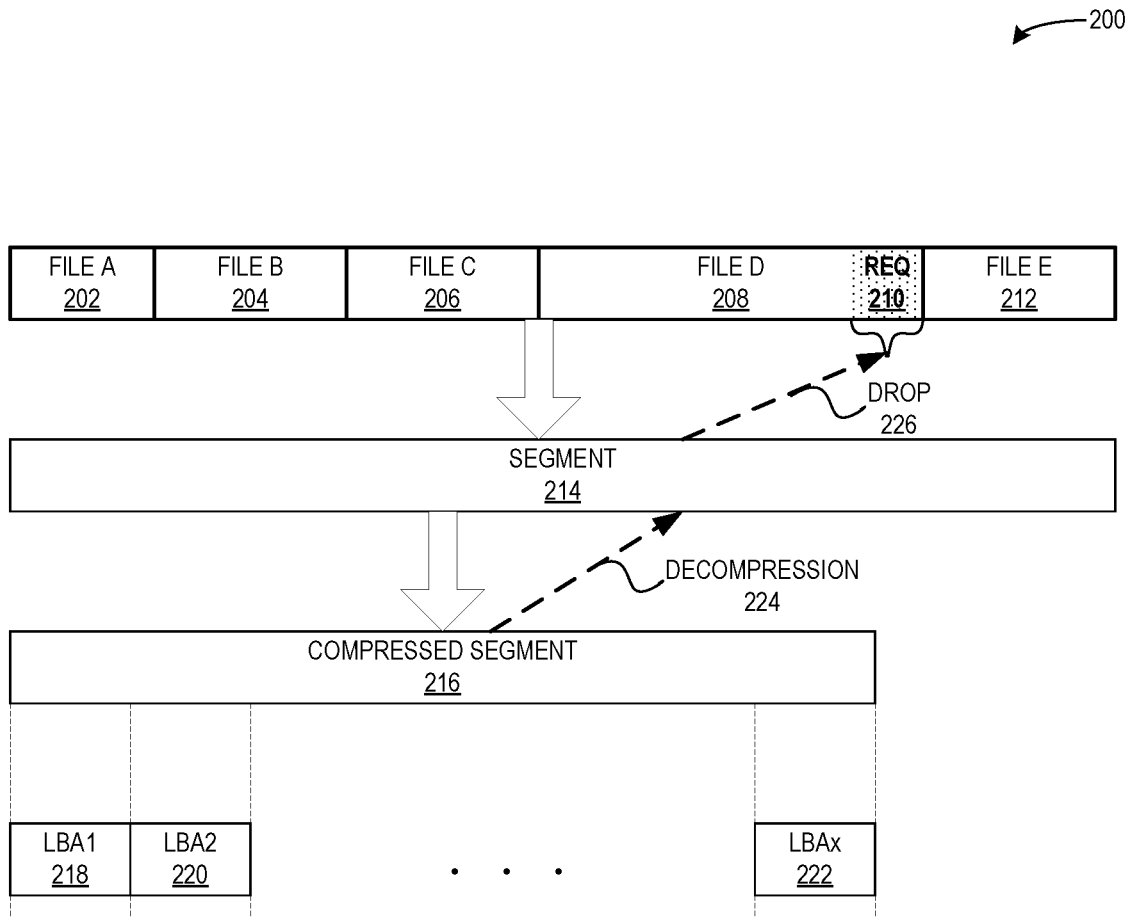
FIG. 2 illustrates an exemplary read amplification in a data compression scheme, in accordance with the prior art.

FIG. 2 illustrates an exemplary read amplification in a data compression scheme, in accordance with the prior art. A system implementing a data compression scheme 200 can receive as input a group of files 202-212, e.g., File A 202, File B 204, File C 206, File D 208, and File E 208, to be compressed. In practice, in order to improve a compression efficiency, it is desirable that an input data be of a large size. Therefore, to improve the compression efficiency, the system can merge or concatenate the files 202-212 to form a large file or segment 214. The system implementing data compression scheme 200 can then apply data compression to segment 214 with a high compression ratio to generate a compressed segment 216. Compressed segment 216 can then be divided to align with LBA1 218, LBA2 220, and LBAx 222.

However, the problems associated with such data compression become evident when processing a read request for a specific file. For example, when a request for data (REQ 210) in File D 208 is received, the system implementing data compression scheme 200 may have to read the entire compressed segment 216 to perform decompression 224. During the process of reading the requested data, the system can drop 226 a large amount of decompressed data before providing the requested data to a requesting client. Therefore, in the traditional data compression scheme 200, the entire segment 214 is read and decompressed irrespective of the size of requested data 210, e.g., size of segment 214 could be much larger than the size of requested data 210. Since a large amount of decompressed data is read and then dropped 226, the resources used for the read and decompression operations can be used inefficiently.

Embodiments disclosed herein describe an efficient data compression scheme that is capable of overcoming the disadvantages of existing data compression schemes described in relation to FIG. 1 and FIG. 2. Specifically, the data compression scheme described in the present disclosure is capable of mitigating the read and write amplifications in the storage system. Furthermore, the compression and decompression engines described in the present disclosure can be incorporated into the storage system architecture in a way that can reduce the amount of data transferred and reduce the bandwidth consumption. In the following paragraphs the implementation details of a novel data compression scheme in accordance with the present disclosure are addressed.

Figure 3:
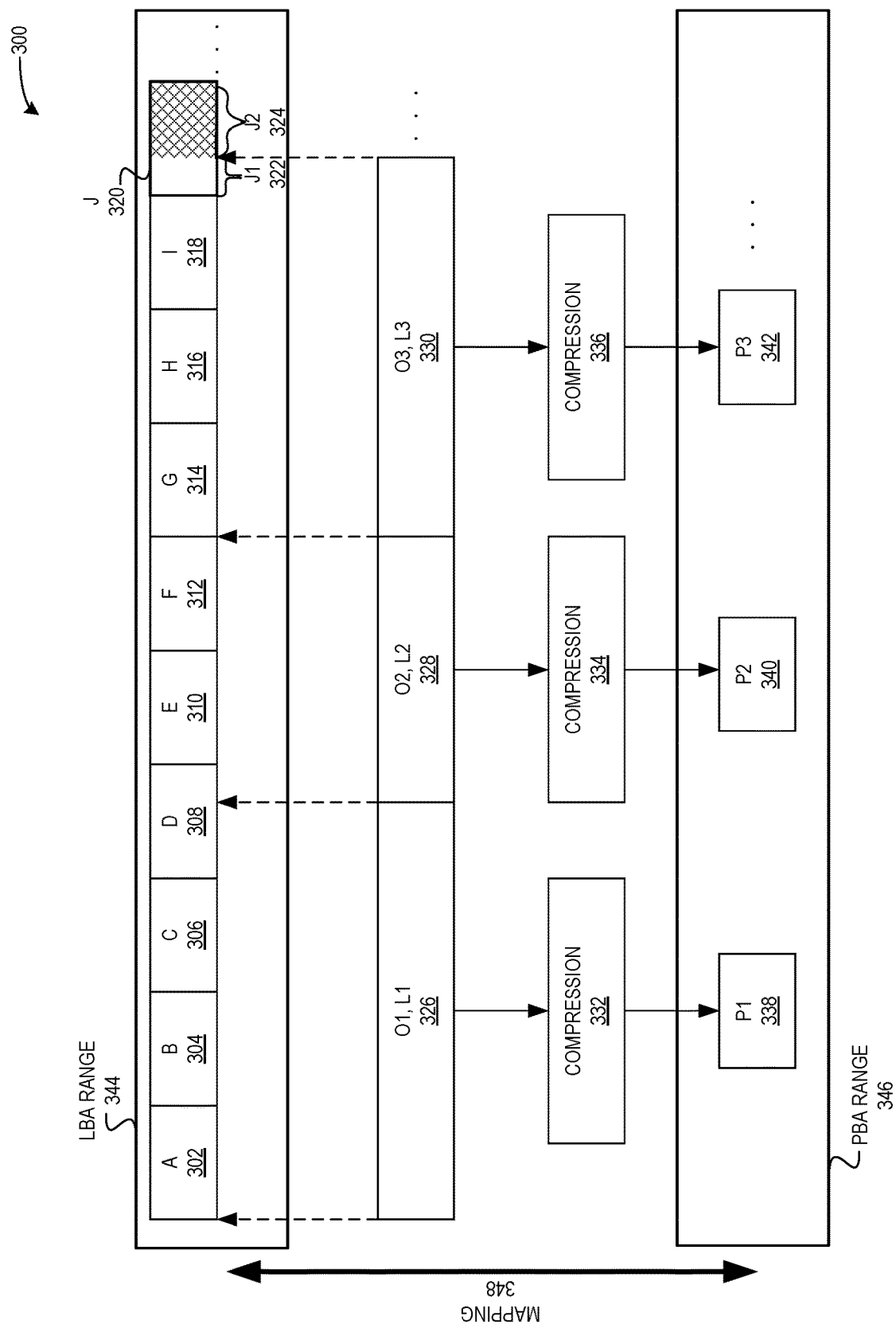
FIG. 3 illustrates an exemplary data compression scheme with fixed-length output, in accordance with an embodiment of the present disclosure.

FIG. 3 illustrates an exemplary data compression scheme with fixed-length output, in accordance with an embodiment of the present disclosure. During operation, a data compression system implementing data compression scheme 300 can receive data to be compressed. For example, the received data could be represented as equal length data portions, i.e., A 302, B 304, C 306, D 308, E 310, F 312, G 314, H 316, I 318, and J 320. Each data portion in the group of data portions A 302-J 320 can be aligned with an LBA in LBA range 344. The system may continuously and incrementally perform compression on the received data portions until the compressed output of the system is aligned with a PBA in a PBA range 346. Data compression system implementing data compression scheme 300 can ensure that the compressed output is of fixed-length and aligned with PBA.

For example, the data compression system may identify that the data portions A 302, B 304, C 306, and a part of D 308 when compressed may result in output P1 338 that aligns with a PBA. The system may use these input data portions as one input data chunk and mark them with an offset and length, e.g., {O1, L1} 326. Note that this input data chunk 326 may not align with LBA. For example, input data chunk 326 may end in the middle of a LBA, e.g., in the middle of D 308. The remaining part of data in the LBA, i.e., remaining part of data in D 308, can be grouped into a later input data chunk 328, i.e., {O2, L2} 328, to generate compressed output P2 340 that is aligned with a PBA. Similarly, data portions G 314, H 316, I 318, and a part of J 320, i.e., J1 322, can be grouped to form an input data chunk 330 with offset O3 and length L3. The system can then compress input data chunk 330 to generate a PBA-aligned compressed output P3 342.

In one embodiment of the present disclosure, the LBAs associated with each of data portions 302-306 and part of 308 can be mapped to one PBA P1 338. Similarly, LBAs of data portions including remaining part of D 308, E 310, and F 312 can be mapped to PBA P2 340. The LBAs of data portions G 314, H 316, I 318, and part of J 320 (i.e., J1 322) can be mapped to PBA P3 342. Note that the system does not apply any data padding to the data portions 302-322 during the data compression process, except at the end of the incoming data J2 324 where data padding can be applied. Since the system stores the compressed data in memory without performing any additional processing on the input data chunks 326, 328, and 330, e.g., reloading and dropping of data, the system implementing data compression scheme 300 can facilitate the mitigation of read and write amplification. The manner in which a mapping 348 between LBAs in LBA range 344 and PBAs in PBA range 346 is built is described below in relation to FIG. 4.

Figure 4:
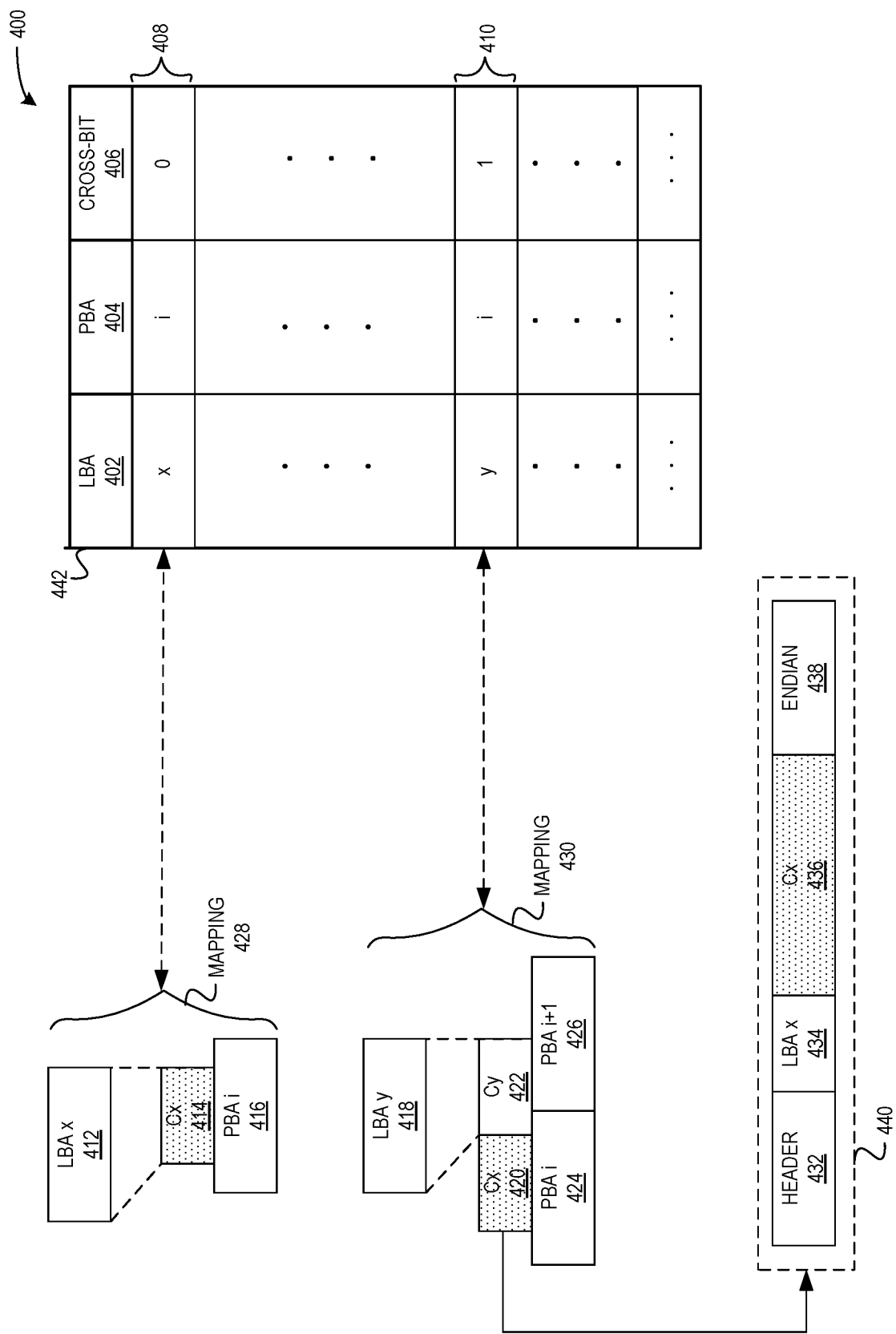
FIG. 4 illustrates an exemplary example of a mapping table used in a data compression scheme, in accordance with an embodiment of the present disclosure.

FIG. 4 illustrates an exemplary example of a mapping table used in a data compression scheme, in accordance with an embodiment of the present disclosure. FIG. 4 shows an implementation 400 of a mapping table which can include mappings between LBAs and PBAs. Mapping table 442 may include the following fields: a LBA 402 field, a PBA 404 field, and a cross-bit 406 field. Mapping table 442 may use LBA as an index of the table to map with a PBA. Cross-bit field 406 may indicate whether compressed data crosses a PBA boundary. In other words, cross-bit field 406 indicates whether only one PBA is to be read or two consecutive PBAs are to be read when processing a read request associated with a LBA.

The data compression system may build mapping table 442 based on the data portions used for performing data compression and the corresponding compressed data portions, e.g., mapping 428. For example, the data compression system may generate compressed data Cx 414 after applying data compression to a data portion LBAx 412. Note that compressed data Cx 414 aligns with PBAi 416 and can be stored in a non-volatile memory. The system may then include an entry 408 in mapping table 442 to denote a mapping between LBAx 412 and PBAi 416. In entry 408 of mapping table 442, cross-bit field 406 is set to "0" to indicate that LBAx 412 after compression generates Cx 414 which aligns with just one PBAi 416. However, when a consecutive data portion aligned with LBAy 418 is compressed, the compressed data portion Cy 422 can be written into both PBAi 424 and PBA i+1 426. The system can include mapping 430 into entry 410 in mapping table 442. Note that since Cy 422 is written into both PBAi 424 and PBAi+1 426, cross-bit field 406 corresponding to entry 410 in mapping table 442 can be set to "1." With cross-bit field 406 set to "1" the system may have to read both PBAi and PBAi+1 when processing a read request for LBAy.

For example, when the system receives a read request for data associated with LBAy 418, the system may first look-up mapping table 442 to identify entry 410 for LBAy. Note that the LBA itself can also be saved in memory along with its data. Since cross-bit field in entry 410 is set to "1" the system may read out both PBAi and PBA i+1 from memory. The system may then first scan PBAi to find a data block 440 including a header 432 and endian 438 associated with LBAx 434 and Cx 436. Header 432 can mark a start position of a space where information associated with LBAx 434 and Cx 436 are stored, and endian 438 can mark an end position of this space. Next, the system may scan PBAi+1 to find another header and endian associated with LBAy and Cy. The system may identify that PBAi+1 includes the compressed form of the requested data LBAy. The system may then only decompress Cy and send the decompressed data associated with LBAy to a requesting client.

Figure 5:
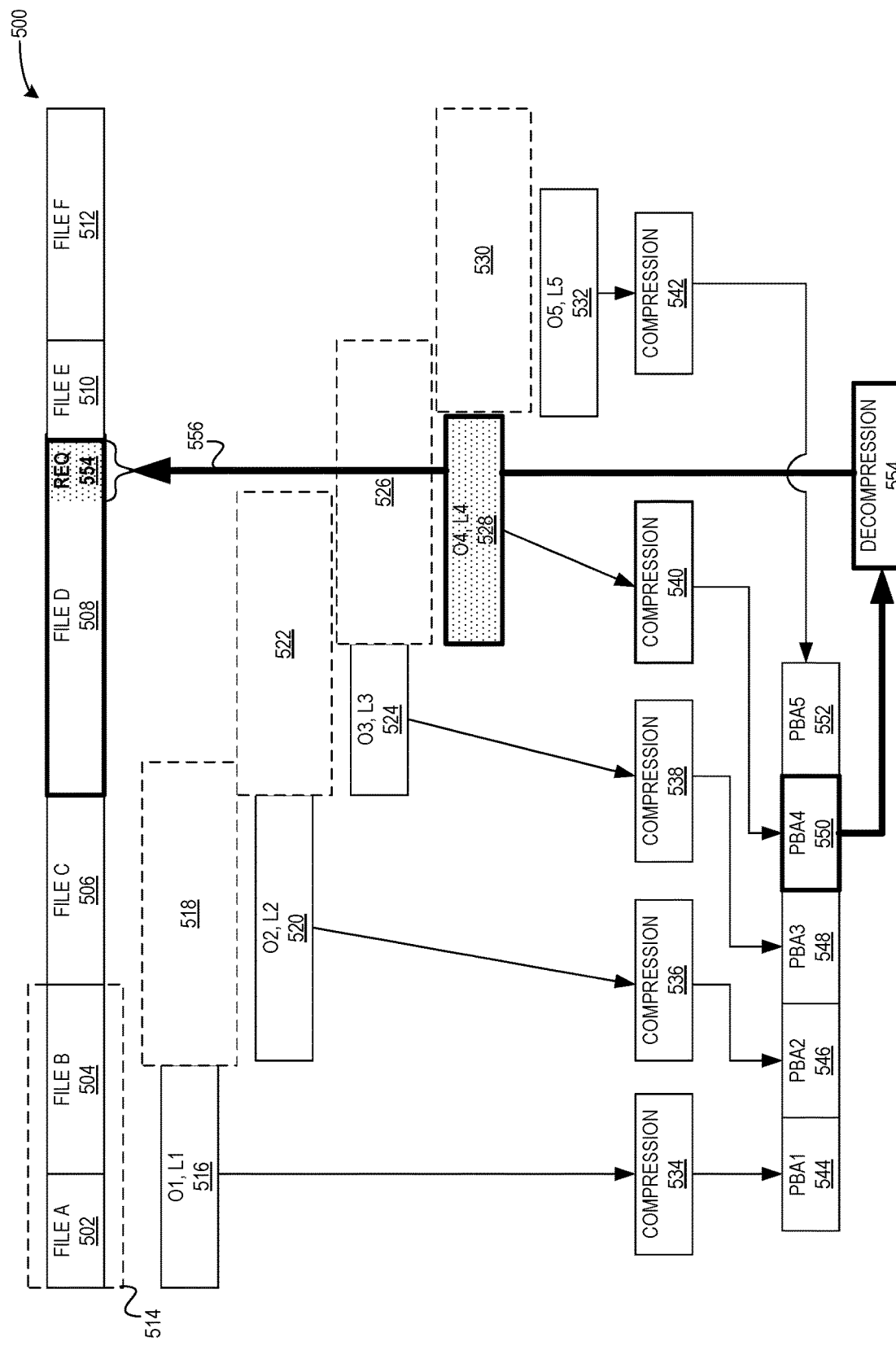
FIG. 5 illustrates an exemplary data compression scheme for reducing read amplification, in accordance with an embodiment of the present disclosure.

FIG. 5 illustrates an exemplary data compression scheme 500 for reducing read amplification, in accordance with an embodiment of the present disclosure. During operation, the data compression system implementing data compression scheme 500 can receive a plurality of files to be compressed. To generate fixed-length compressed outputs, the system may apply a sliding window to the received files, e.g., File A 502, File B 504, File C 506, File D 508, File E 510, and File F 512. The system can move the sliding window consecutively from left to right along the received files.

When compressed data for a specific data portion within the sliding window aligns or reaches the size of a PBA, the system may temporarily halt the movement of the sliding window. The system may then mark the specific data portion within the sliding window with an offset/length and truncate this portion from the received files to represent a data input to a data compression engine. The system may then resume the movement of the sliding window from the end of the specific data portion marked with offset/length and can continue to seek data to be compressed into one or more aligned PBAs. The system can continue to move the sliding window to the end of the received files for generating PBA-aligned compressed data.

For example, sliding window 514 can include entire File A 502 and a portion of File B 504. The data compression system may start compressing in increments data within sliding window 514. In other words, instead of compressing all the data available within sliding window 514, the system may compress incremental amounts of data until a total length of compressed output aligns with a PBA1 544. When the system determines that the compressed output length aligns with a PBA, the system may truncate a data chunk 516 from the files included within sliding window 514. The system may mark data chunk 516 with a length and an offset pair {O1, L1}. The system may then use data chunk 516 as an input to a compression engine 534 for generating compressed output that is aligned with PBA1 544.

The system can then move sliding window 514 to a position where data chunk 516 ends. This new position of sliding window 514 is indicated by dashed block 518 in FIG. 5. The system may continue to move sliding window 514 along the set of received files 502-512 until the end of the received files is reached. This movement of sliding window 514 is denoted by blocks 518, 522, 526, and 530. As the sliding window moves consecutively along the received files 504-512, the system can provide different data chunks to a compression engine to generate multiple PBA-aligned compressed data.

Specifically, the system may apply sliding window 518 to truncate data chunk {O2,L2} 520 from the received files and apply compression 536 to data chunk 520 to obtain compressed data aligned with PBA2 546. Similarly, the system may use the different positions 522, 526, and 530 of sliding window along the received files to identify data chunks {O3,L3} 524, {O4,L4} 528, and {O5,L5} 532, respectively. The system may apply compression 538, 540, and 542 to data chunks 524, 528, and 532, respectively. The output of compression 538, 540, and 542 can include fixed-length PBA-aligned compressed data, i.e., PBA3 548, PBA4 550, and PBA5 540, respectively.

When the system receives a read request, e.g., a request to read a portion of data REQ 554 from File D 508, the system may process the read request for REQ 554 by first locating a corresponding PBA containing compressed data. For example, the system may use LBA associated with the read request to look-up a mapping table (shown in FIG. 4) to identify a PBA corresponding to the LBA in the read request. Specifically, the system may identify PBA4 550 to be storing the compressed data associated with the LBA in the read request. The system may apply a decompression engine 554 to decompress compressed data in PBA4 550 to obtain decompressed data chunk {O4, L4} 528. Next, the system may read requested data REQ 554 from data chunk 528 and provide data REQ 554 to a client that sent the read request.

Data compression schemes shown in FIG. 1 and FIG. 2, apply data compression to fixed-length input data to generate variable-length compressed outputs resulting in an increased read/write amplification during the data-intensive compression process. Further, when processing a read request, the existing data processing schemes can deliver a suboptimal performance because large compressed data chunks are decompressed and a significant portion of the decompressed data are dropped before actually sending the requested data. Such a suboptimal performance of the existing data compression schemes can result in high read/write amplification, high latency, and inefficient use of communication bandwidth.

In the exemplary embodiments shown in FIG. 5, the system can generate fixed-length PBA-aligned compressed data from varied-length input data chunks. Further, the system can apply a sliding window to the received files to mitigate I/O amplification during the data compression process. Moreover, when processing a read request the data compression system described in the present disclosure is capable of satisfying a small-sized read by reading just one or two PBAs, thereby reducing read amplification and the amount of data dropped when processing the read request. The reduction in read/write amplification can have an improved performance impact on the storage system in terms of latency, the amount of data transferred, and communication bandwidth consumption.

System Architecture

Figure 6A:
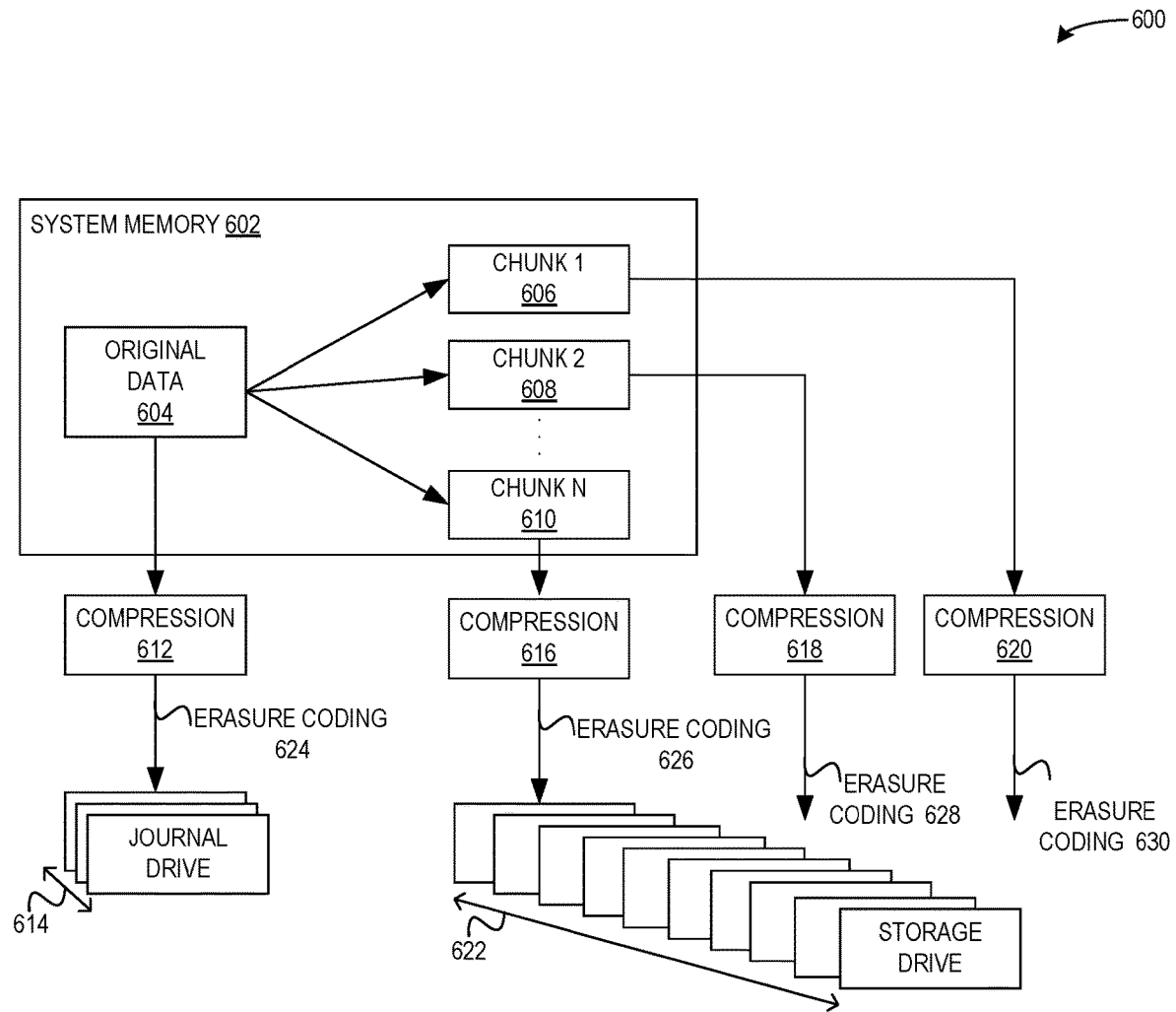
FIG. 6A illustrates an exemplary system architecture, in accordance with the prior art.

FIG. 6A illustrates an exemplary system architecture 600, in accordance with the prior art. In a distributed storage system, data compression can be applied at multiple places for generating different data formats. For example, system memory 602 can store original data 604 to be compressed, and original data 604 can be divided into data chunks 606-610 prior to applying compression. Specifically, compression 612 is applied to original data 604 to generate compressed original data. The system can then apply erasure coding (EC) 624 to the compressed original data prior to storing them in multiple journal drives 614. The system can also apply compression 616-620 to data chunks 606-610, respectively to generate compressed data chunks. These compressed data chunks are then subject to EC 626-630 prior to being distributed and stored in multiple storage drives 622. Note that in system architecture 600 since compression engines 612, 616-620 are placed after system memory 602, the system may require considerable amount of memory to store uncompressed original data 604. Further, uncompressed original data 604 and data chunks 606-610 are sent towards journal drives 614 and storage drives 622, which may result in a high consumption of network bandwidth.

Figure 6B:
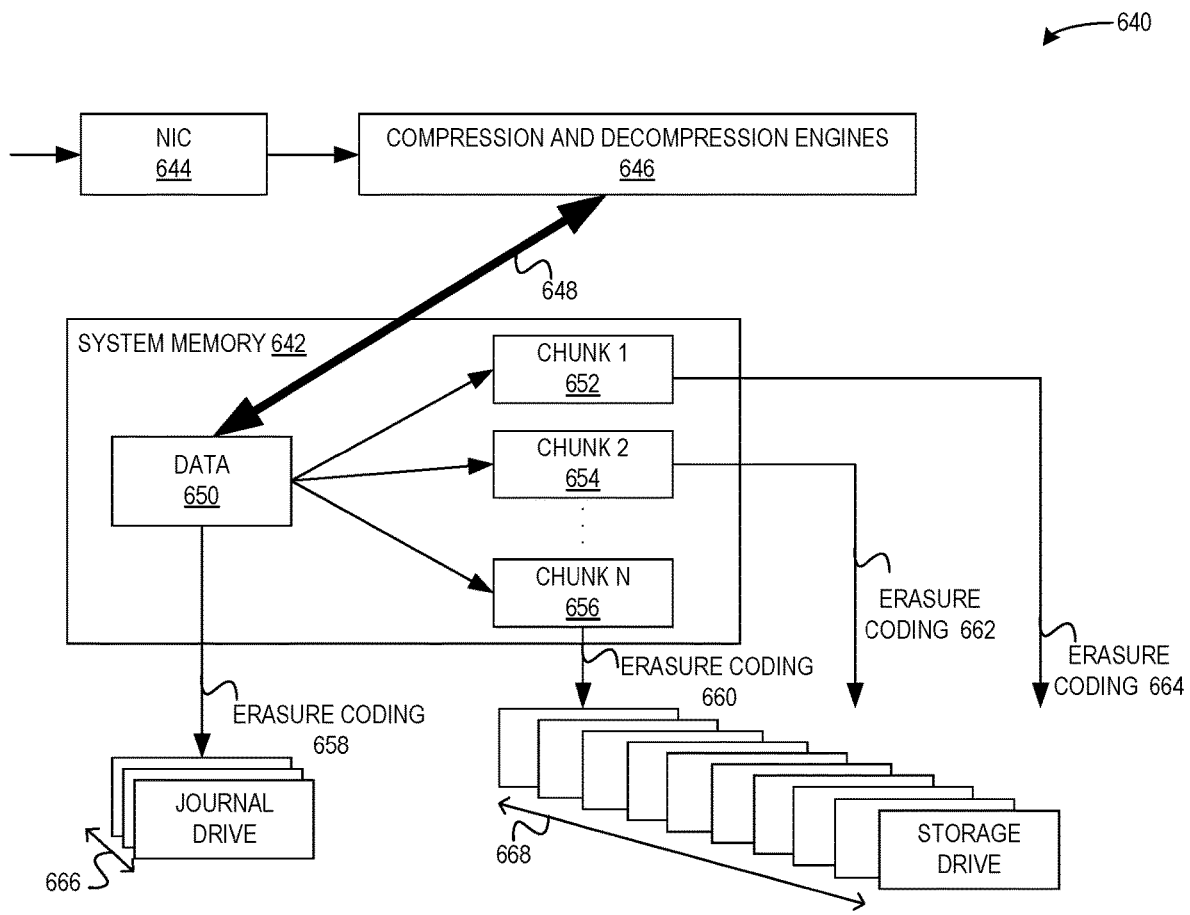
FIG. 6B illustrates an exemplary modified system architecture, in accordance with an embodiment of the present disclosure.

FIG. 6B illustrates an exemplary modified system architecture 640, in accordance with an embodiment of the present disclosure. System architecture 640 can integrate data compression and decompression engines 646 at the data input in network interface card (NIC) 644. The data received via NIC 644 is compressed at 646 before transferring 648 and storing compressed data 650 in system memory 642. Compressed data 650 can then be treated as original data of the storage cluster. For example, in system memory 642 compressed data 650 can be divided into data chunks 652-656. The system may then apply erasure coding (EC) 658 to compressed data 650 prior to storing them in multiple journal drives 666. The system may also apply EC 660-664 to compressed data chunks 652-656 prior to distributing and storing them in multiple storage drives 668. Note that in system architecture 640, since compression and decompression engines 646 are placed at the entrance of the storage cluster, the amount of data transfer within system architecture 640 can be reduced. Therefore, an overall burden on the data transfer and data processing operations can be mitigated.

Exemplary Method for Facilitating a Data Compression Scheme

Figure 7A:
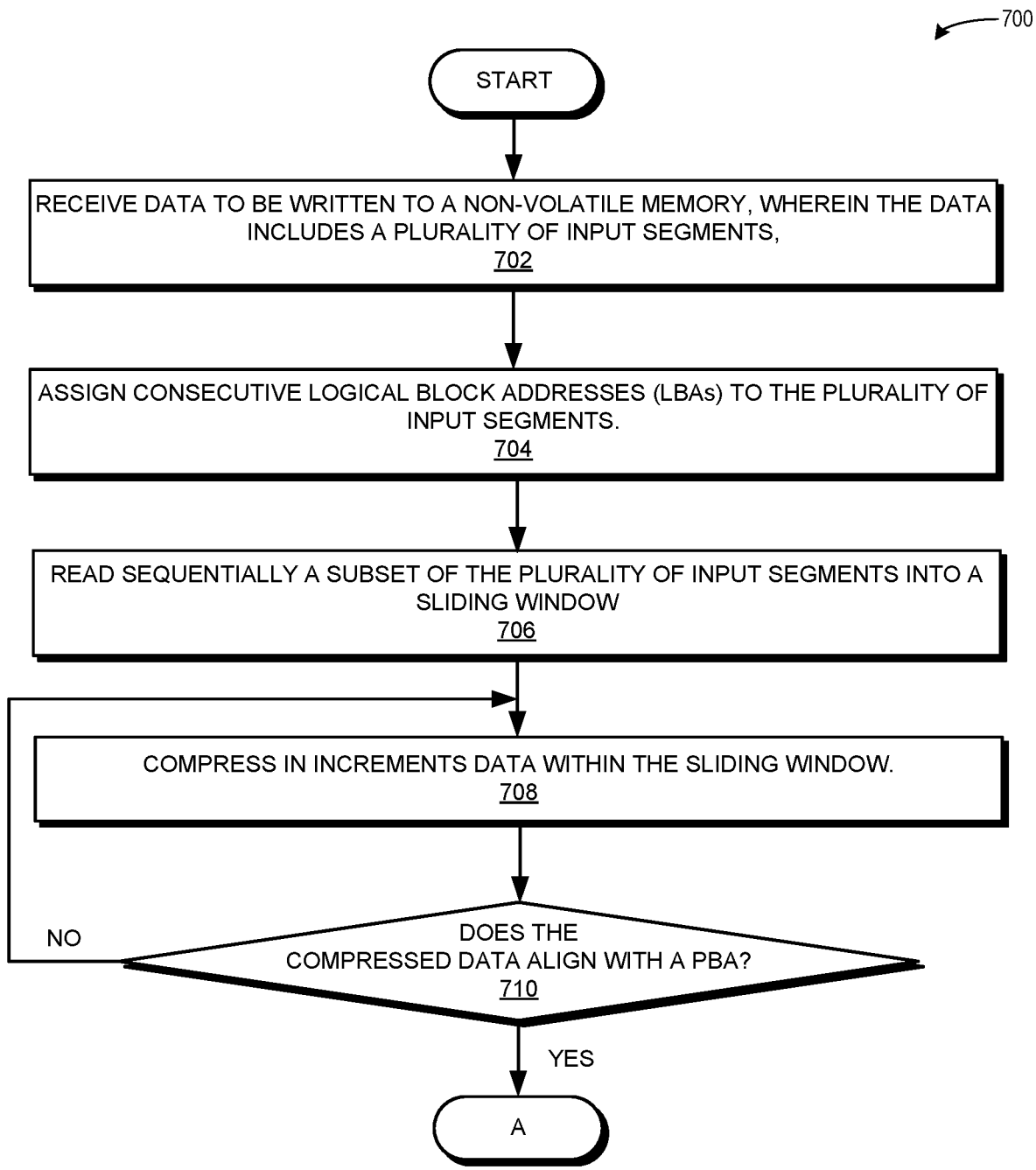
FIG. 7A presents a flowchart illustrating a method for facilitating a data compression scheme, in accordance with an embodiment of the present disclosure.

FIG. 7A presents a flowchart 700 illustrating a method for facilitating a data compression scheme, in accordance with an embodiment of the present disclosure. During operation, the system can receive data to be written to a non-volatile memory in the storage system (operation 702). The received data can include a plurality of input segments. The system can assign consecutive logical block addresses (LBAs) to the plurality of input segments (operation 704). The system can then compress the plurality of input segments to generate a plurality of fixed-length compressed segments, with each compressed segment aligned with a physical block address (PBA) in a set of PBAs. Specifically, the system can first sequentially read a subset of the plurality of input segments into a sliding window (operation 706). Next, the system can compress in increments data within the sliding window (operation 708). The system may determine whether the compressed data aligns with a PBA (operation 710).

In response to the system determining that the compressed data does not align with the PBA, the system may continue to incrementally compress data in the sliding window (e.g., by applying operations 708 and 710 to incrementally compress data). In response to the system determining that the compressed data aligns with the PBA, i.e., a length of compressed data is equal to a length of the PBA, the system can continue operation at Label A of FIG. 7B.

Figure 7B:
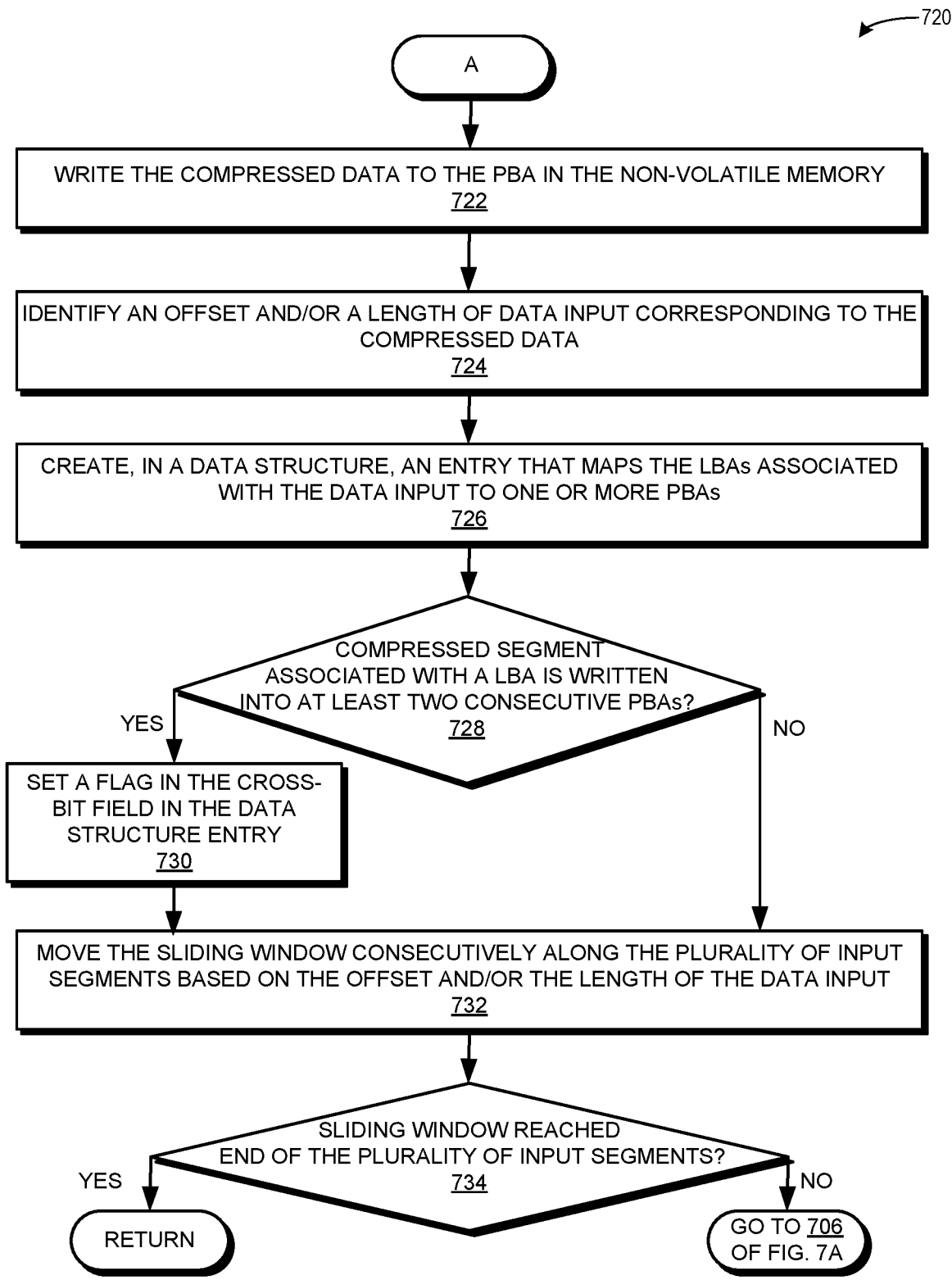
FIG. 7B presents a flowchart illustrating a method for facilitating a data compression scheme, in accordance with an embodiment of the present disclosure.

FIG. 7B presents a flowchart 720 illustrating a method for facilitating a data compression scheme, in accordance with an embodiment of the present disclosure. During operation, the system may write the compressed data to the PBA in the non-volatile memory (operation 722). The system may identify and save an offset and/or a length of data input corresponding to the compressed data (operation 724). The system can then create, in a data structure, an entry that maps the LBAs of the input segments used for generating the compressed data to one or more PBAs (operation 726). The system can then determine whether the compressed output associated with the LBA is written to at least two consecutive PBAs (operation 728). If the condition in operation 728 is true, then the system can set a flag in a cross-bit field in the data structure entry (operation 730). If the condition in operation 728 is false, then the system may continue to operation 732.

The system can proceed to move the sliding window consecutively along the plurality of input segments based on the offset and/or the length of the data input (operation 732). In other words, the system may move the sliding window to start from a position where the previous data input ended. Next, the system can determine whether the sliding window has reached the end of the plurality of input segments in the received data (operation 734). In response to the system determining that the condition in operation 734 is satisfied, the operation returns. In response to the system determining that the condition in operation 734 is not satisfied, the operation continues to operation 706 of FIG. 7A (e.g., by applying operations 706, 708, and 710 to the remaining plurality of input segments that are yet to be compressed).

Figure 7C:
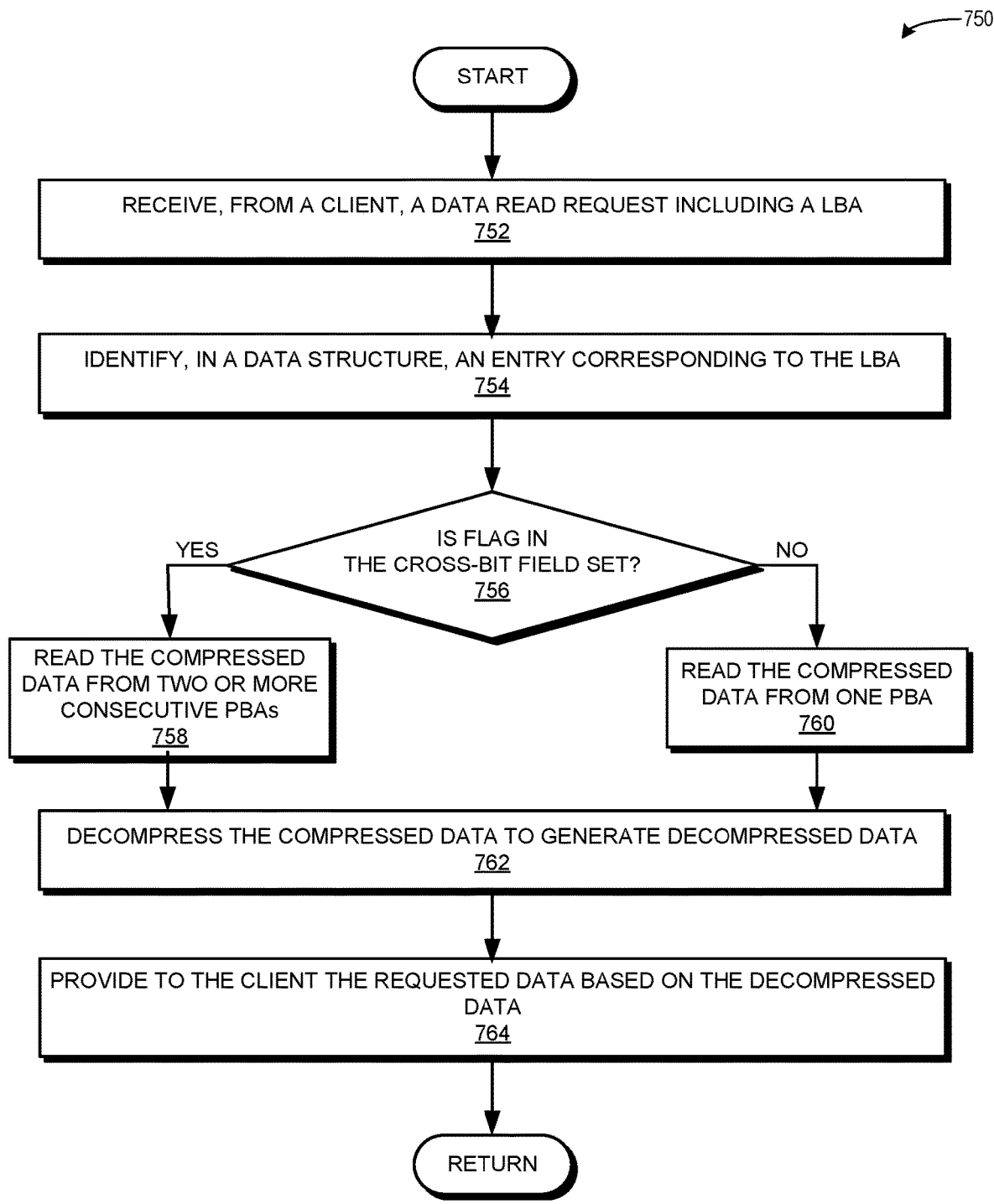
FIG. 7C presents a flowchart illustrating a method for facilitating a data compression scheme to process a read request, in accordance with an embodiment of the present disclosure.

FIG. 7C presents a flowchart 750 illustrating a method for facilitating a data compression scheme to process a read request, in accordance with an embodiment of the present disclosure. During operation, the system may receive, from a client, a data read request including an LBA (operation 752). The system can then identify in a data structure an entry corresponding to the LBA (operation 754). The system can then determine whether a flag in a cross-bit field in the data structure entry is set (operation 756). When the flag is set, the system may read compressed data from two or more consecutive PBAs (operation 758). When the flag is not set, then the system can read the compressed data from just one PBA (operation 760). Next, the system can decompress the compressed data to generate decompressed data (operation 762). The system can then provide to the requesting client the requested data based on the decompressed data (operation 764) and the operation returns.

Exemplary Computer System and Apparatus

Figure 8:
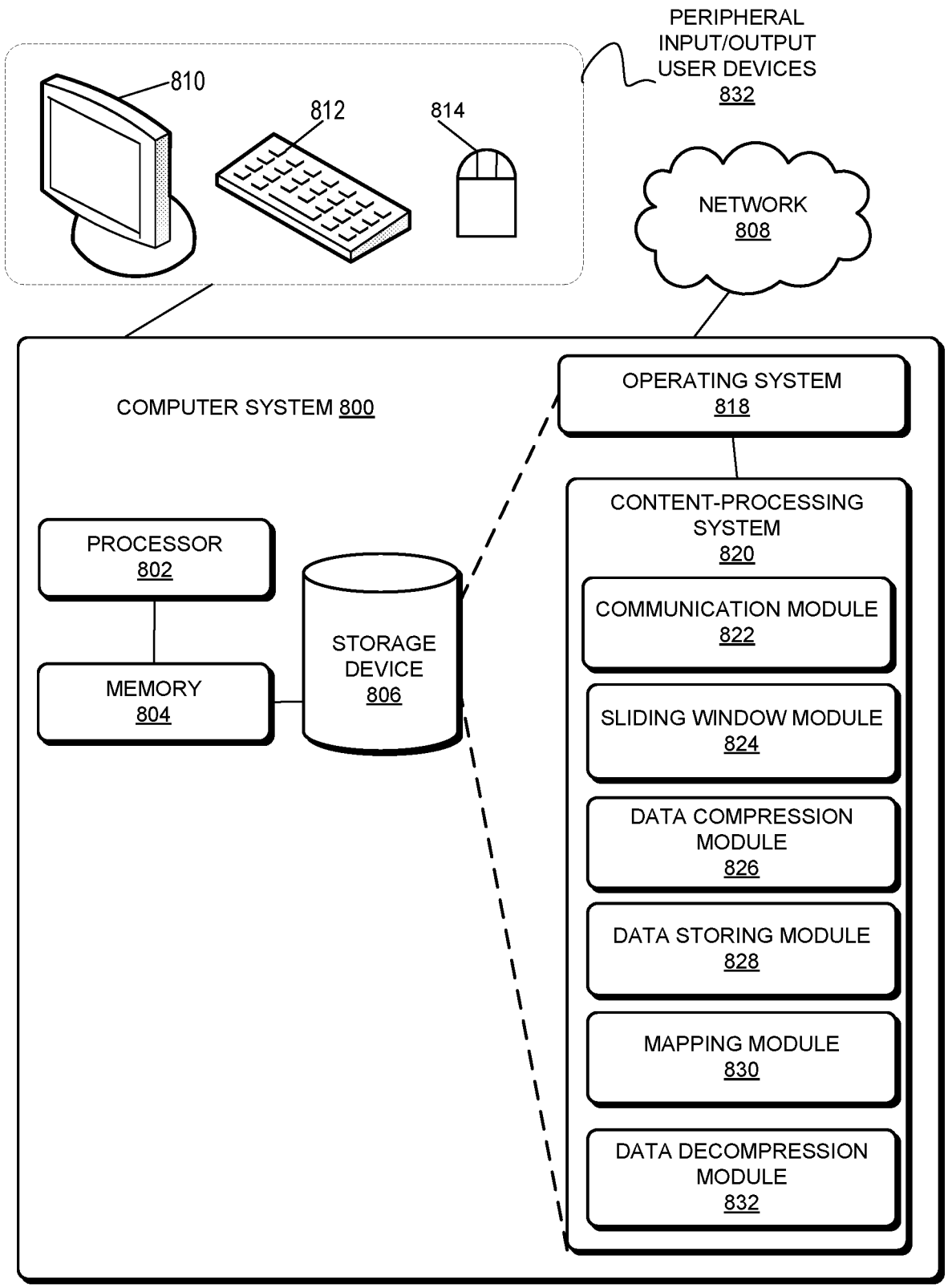
FIG. 8 illustrates an exemplary computer system that facilitates a data compression scheme, in accordance with an embodiment of the present disclosure.

FIG. 8 illustrates an exemplary computer system that facilitates a data compression scheme, in accordance with an embodiment of the present disclosure. Computer system 800 includes a processor 802, a memory 804, and a storage device 806. Computer system 800 can be coupled to a plurality of peripheral input/output devices 832, e.g., a display device 810, a keyboard 812, and a pointing device 814, and can also be coupled via one or more network interfaces to network 808. Storage device 806 can store an operating system 818 and a content processing system 820.

In one embodiment, content processing system 820 can include instructions, which when executed by processor 802 can cause computer system 800 to perform methods and/or processes described in this disclosure. During operation of computer system 800, content processing system 820 can include instructions for receiving a set of files for performing data compression (communication module 822). Content processing system 820 may further include instructions for applying a sliding window to the set of received files (sliding window module 824). Sliding window module 824 can move the sliding window consecutively along the set of received files until the end of the set of received files is reached. At each position of the sliding window, sliding window module 824 may truncate only that portion of data within the sliding window which would produce a fixed-length PBA-aligned compressed data.

Content processing system 820 can include instructions for compressing data within the sliding window to generate PBA-aligned compressed data (data compression module 826). Content processing system 820 can include instructions for storing the PBA-aligned compressed data in a PBA of a non-volatile memory (data storing module 828). Content processing system 820 can further include instructions to build a mapping table that includes a set of mappings between a set of LBAs of plurality of input segments associated with the received files to one or more PBAs of the corresponding compressed data (mapping module 830).

Content processing system 820 can further include instructions for processing a read request from a client (communication module 822). Specifically, the read request can be processed by first looking-up the mapping table to identify a LBA that was included in the read request. After the LBA has been identified in the mapping table, corresponding PBAs can be determined from the mapping table based on a flag setting in a cross-bit field. Decompression of compressed data is performed on the one or more PBAs identified in the mapping table to generate decompressed data (data decompression module 832). Content processing system 820 can include instructions to send the requested data to the client based on the decompressed data (communication module 822).

Figure 9:
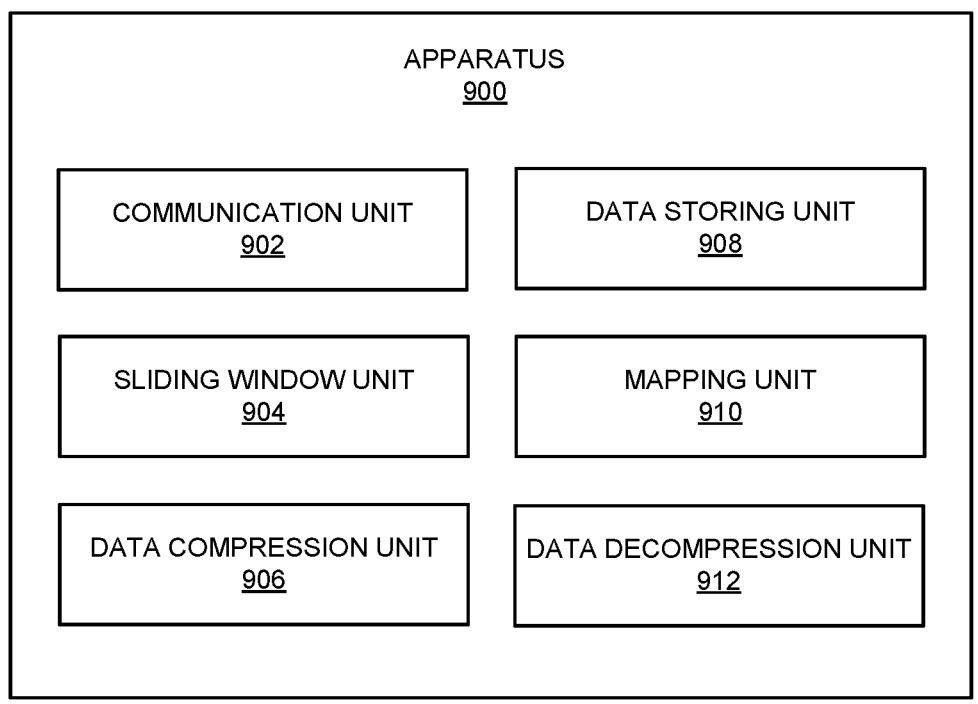
FIG. 9 illustrates an exemplary apparatus that facilitates a data compression scheme, in accordance with an embodiment of the present disclosure.

FIG. 9 illustrates an exemplary apparatus that facilitates a data compression scheme, according to one embodiment of the present disclosure. Apparatus 900 can include a plurality of units or apparatuses that may communicate with one another via a wired, wireless, quantum light, or electrical communication channel. Apparatus 900 may be realized using one or more integrated circuits, and may include fewer or more units or apparatuses than those shown in FIG. 8. Further, apparatus 900 may be integrated in a computer system, or realized as a separate device that is capable of communicating with other computer systems and/or devices. Specifically, apparatus 900 can include units 902-912, which perform functions or operations similar to modules 822-832 of computer system 800 in FIG. 8. Apparatus 900 can include: a communication unit 902, a sliding window unit 904, a data compression unit 906, a data storing unit 908, a mapping unit 910, and a data decompression unit 912.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A computer-implemented method, comprising:
receiving data to be written to a non-volatile memory, wherein the data includes a plurality of input segments, which are assigned with consecutive logical block addresses (LBAs);
compressing the plurality of input segments to generate a plurality of fixed-length compressed segments, with each fixed-length compressed segment aligned one or more physical block addresses (PBAs) in a set of PBAs, wherein compressing the plurality of input segments comprises:
reading sequentially a subset of the plurality of input segments into a sliding window, wherein the subset includes one or more of the input segments;

incrementally compressing data in the sliding window until compressed data length satisfies a fixed length associated with a PBA;

in response to determining that the compressed data length satisfies the fixed length:
identifying an offset and/or a length of data input corresponding to the compressed data; and
writing the compressed data to the PBA in the non-volatile memory; and moving the sliding window consecutively along the plurality of input segments based on the offset and/or the length of the data input;

writing a respective compressed segment into one or more memory blocks addressed with respective PBAs in the non-volatile memory; and creating, in a data structure, a set of entries which map the LBAs of the input segments to the set of PBAs, wherein creating the set of entries comprises:
determining that the compressed segment associated with a LBA and stored in the non-volatile memory crosses a boundary between the two consecutive memory blocks addressed with respective PBAs; and
setting a field corresponding to the LBA in the data structure.

2. The method of claim 1, wherein the data structure includes:
an index field which includes a LBA as an index of the data structure;
a PBA field; and
a cross-bit field which indicates whether data in one LBA is written into one PBA or more than one PBA.

3. The method of claim 1, further comprising:
receiving, from a client, a data read request including the LBA;
identifying, in the data structure, one or more PBAs corresponding to the LBA;
reading compressed data from the one or more PBAs;
decompressing the compressed data to generate decompressed data; and
providing, to the client, requested data based on the decompressed data.

4. The method of claim 3, wherein reading the compressed data from the one or more PBAs further comprises:
reading the compressed data from one PBA when a flag in a cross-bit field corresponding to the LBA in the data structure is not set; and
reading the compressed data from two or more consecutive PBAs when the flag in the cross-bit field corresponding to the LBA in the data structure is set.

5. The method of claim 1, further comprising:
applying erasure coding to the plurality of compressed segments prior to writing the compressed segments to a journal drive.

6. The method of claim 1, further comprising:
applying erasure coding to the plurality of compressed segments prior to writing the compressed segments to different storage nodes in a distributed storage system.

7. The method of claim 1, wherein compressing the plurality of input segments further comprises:
continuously performing the incrementally compressing the data in the sliding window until the compressed data length satisfied the fixed length associated with the PBA.

8. The method of claim 1, wherein compressing the plurality of input segments is performed by a compression/decompression engine associated with a network interface card while receiving the data to be written to the non-volatile memory, wherein the compression/decompression engine resides at an entrance to different storage nodes in a distributed storage system.

9. A computer system, comprising:
a co-processor; and
a storage device coupled to the processor and storing instructions, which when executed by the co-processor cause the co-processor to perform a method, the method comprising:
receiving data to be written to a non-volatile memory, wherein the data includes a plurality of input segments, which are assigned with consecutive logical block addresses (LBAs);
compressing the plurality of input segments to generate a plurality of fixed-length compressed segments, with each fixed-length compressed segment aligned with a one or more physical block addresses (PBAs) in a set of PBAs, wherein compressing the plurality of input segments comprises:
reading sequentially a subset of the plurality of input segments into a sliding window, wherein the subset includes one or more of the input segments;
incrementally compressing data in the sliding window until compressed data length satisfies a fixed length associated with a PBA;
in response to determining that the compressed data length satisfies the fixed length:
identifying an offset and/or a length of data input corresponding to the compressed data; and
writing the compressed data to the PBA in the non-volatile memory; and
moving the sliding window consecutively along the plurality of input segments based on the offset and/or the length of the data input;
writing a respective compressed segment into one or more memory blocks addressed with respective PBAs in the non-volatile memory; and
creating, in a data structure, a set of entries which map the LBAs of the input segments to the set of PBAs, wherein creating the set of entries comprises:
determining that the compressed segment associated with a LBA and stored in the non-volatile memory crosses a boundary between the two consecutive memory blocks addressed with respective PBAs; and
setting a field corresponding to the LBA in the data structure.

10. The computer system of claim 9, wherein the data structure includes:
an index field which includes a LBA as an index of the data structure;
a PBA field; and
a cross-bit field which indicates whether data in one LBA is written into one PBA or more than one PBA.

11. The computer system of claim 9, wherein the method further comprises:
receiving, from a client, a data read request including the LBA;
identifying, in the data structure, one or more PBAs corresponding to the LBA;
reading compressed data from the one or more PBAs;
decompressing the compressed data to generate decompressed data; and
providing, to the client, requested data based on the decompressed data.

12. The computer system of claim 11, wherein reading the compressed data from the one or more PBAs further comprises:
   reading the compressed data from one PBA when a flag in a cross-bit field corresponding to the LBA in the data structure is not set; and
   reading the compressed data from two or more consecutive PBAs when the flag in the cross-bit field corresponding to the LBA in the data structure is set.

13. The computer system of claim 9, wherein the method further comprises:
   applying erasure coding to the plurality of compressed segments prior to writing the compressed segments to a journal drive.

14. The computer system of claim 9, wherein the method further comprises:
   applying erasure coding to the plurality of compressed segments prior to writing the compressed segments to different storage nodes in a distributed storage system.

15. The computer system of claim 9, wherein compressing the plurality of input segments is performed by a compression/decompression engine associated with a network interface card while receiving the data to be written to the non-volatile memory, wherein the compression/decompression engine resides at an entrance to different storage nodes in a distributed storage system.

16. An apparatus, comprising:
   a co-processor; and
   a storage medium storing instructions, which when executed by the co-processor cause the co-processor to perform a method, the method comprising:
      receiving data to be written to a non-volatile memory, wherein the data includes a plurality of input segments, which are assigned with consecutive logical block addresses (LBAs);
      compressing the plurality of input segments to generate a plurality of fixed-length compressed segments, with each fixed-length compressed segment aligned with one or more physical block address (PBA) in a set of PBAs, wherein compressing the plurality of input segments comprises:
         reading sequentially a subset of the plurality of input segments into a sliding window, wherein the subset includes one or more of the input segments;
         incrementally compressing data in the sliding window until compressed data length satisfies a fixed length associated with a PBA;
         in response to determining that the compressed data length satisfies the fixed length:
            identifying an offset and/or a length of data input corresponding to the compressed data; and
            writing the compressed data to the PBA in the non-volatile memory; and
         moving the sliding window consecutively along the plurality of input segments based on the offset and/or the length of the data input;
      writing a respective compressed segment to one or more memory blocks addressed with respective PBAs in the non-volatile memory; and
      creating, in a data structure, a set of entries which map the LBAs of the input segments to the set of PBAs, wherein creating the set of entries comprises:
         determining that the compressed segment associated with a LBA and stored in the non-volatile memory crosses a boundary between the two consecutive memory blocks addressed with respective PBAs; and
         setting a field corresponding to the LBA in the data structure.

17. The apparatus of claim 16, wherein the data structure includes:
   an index field which includes a LBA as an index of the data structure;
   a PBA field; and
   a cross-bit field which indicates whether data in one LBA is written into one PBA or more than one PBA.

18. The apparatus of claim 16, wherein the method further comprises:
   receiving, from a client, a data read request including the LBA;
   identifying, in the data structure, one or more PBAs corresponding to the LBA;
   reading compressed data from the one or more PBAs;
   decompressing the compressed data to generate decompressed data; and
   providing, to the client, requested data based on the decompressed data.

19. The apparatus of claim 18, wherein reading the compressed data from the one or more PBAs further comprises:
   reading the compressed data from one PBA when a flag in a cross-bit field corresponding to the LBA in the data structure is not set; and
   reading the compressed data from two or more consecutive PBAs when the flag in the cross-bit field corresponding to the LBA in the data structure is set.

20. The apparatus of claim 16, wherein the method further comprises:
   applying erasure coding to the plurality of compressed segments prior to writing the compressed segments at least one of:
   a journal drive; and
   different storage nodes in a distributed storage system.

* * * * *